(12) United States Patent
Obkircher

(10) Patent No.: US 7,919,997 B2
(45) Date of Patent: Apr. 5, 2011

(54) SYSTEMS AND METHODS FOR PROVIDING A CLOCK SIGNAL

(75) Inventor: Thomas Obkircher, Tustin, CA (US)

(73) Assignee: Skyworks Solutions, Inc., Woburn, MA (US)

(*) Notice: Subject to any disclaimer, the term of this patent is extended or adjusted under 35 U.S.C. 154(b) by 159 days.

(21) Appl. No.: 12/117,226

(22) Filed: May 8, 2008

(65) Prior Publication Data

US 2008/0278203 A1 Nov. 13, 2008

Related U.S. Application Data

(60) Provisional application No. 60/928,786, filed on May 11, 2007.

(51) Int. Cl.
*H03B 19/00* (2006.01)
(52) U.S. Cl. .................................. 327/119; 327/116
(58) Field of Classification Search .................. 327/116, 327/119, 158–161, 156; 377/47, 48
See application file for complete search history.

(56) References Cited

U.S. PATENT DOCUMENTS

| 5,970,110 | A | 10/1999 | Li |
| 6,369,622 | B1 | 4/2002 | Lim et al. |
| 6,720,806 | B1 * | 4/2004 | Merrill et al. ............... 327/116 |
| 6,826,247 | B1 | 11/2004 | Elliott |
| 7,061,285 | B2 | 6/2006 | Woods |
| 7,180,340 | B2 * | 2/2007 | Jung et al. .................. 327/116 |
| 2004/0095169 | A1 * | 5/2004 | Kaneko ......................... 327/119 |
| 2008/0136532 | A1 * | 6/2008 | Hufford et al. .............. 331/10 |
| 2009/0189652 | A1 * | 7/2009 | Kim et al. .................... 327/116 |

FOREIGN PATENT DOCUMENTS

| JP | 08079061 A | 3/1996 |
| JP | 2006073182 A | 3/2006 |
| KR | 100515074 B1 | 9/2005 |

* cited by examiner

*Primary Examiner* — Lincoln Donovan
*Assistant Examiner* — Diana J Cheng
(74) *Attorney, Agent, or Firm* — Lando & Anastasi, LLP

(57) ABSTRACT

Systems and methods for providing a clock signal are provided. A frequency multiplier circuit is provided that can include a plurality of serially connected delay elements that are configured to generate a plurality of delay tap signals from an input signal. The frequency multiplier circuit can also include a phase detector configured to receive a first selected delay tap signal and the input signal. The phase detector can detect a phase shift between the first selected delay tap signal and the input signal, and can generate a phase detection signal indicative of a value of the phase shift. The frequency multiplier circuit can also include a digital logic gate configured to receive the input signal and a second selected delay tap signal. The digital logic gate can be further configured to generate an output signal responsive to the second selected delay tap signal and the input signal. The frequency multiplier circuit can also include a controller coupled to the phase detector and coupled to an output gate. The controller can be configured to receive the phase detection signal and to enable the output gate when the value of the phase shift corresponds to a predetermined value. The output gate can provide the output signal when enabled.

29 Claims, 13 Drawing Sheets

SYSTEMS AND METHODS FOR PROVIDING A CLOCK SIGNAL

CROSS REFERENCE TO RELATED APPLICATIONS

This application claims priority under 35 U.S.C. 119(e) to U.S. Provisional Application Ser. No. 60/928,786, entitled "Clock Doubler With Auto-Calibration," filed May 11, 2007, which is incorporated herein by reference in its entirety.

BACKGROUND

1. Field of Invention

At least one embodiment of the present invention relates generally to control systems and methods for generating a signal, and more specifically, for generating an output signal having a frequency that is a multiple of a frequency of the input signal.

2. Discussion of Related Art

Digital circuits and their components are driven by clock signals that oscillate between a high state and a low state at a given frequency. Clock signals can be used to synchronize various system components, and to direct the operation of one or more circuits within the system. A clock signal can operate as a source for many different circuits that form part of a device, such as a computer or mobile telephone handset. However, various circuits or their components within such devices can require different frequencies in order to operate properly or more efficiently, and therefore, a single clock signal operating at a fixed frequency may be insufficient to drive varying circuits and to meet their differing requirements.

Mobile telephone handsets and other electronic devices require multiple clock signals at different frequencies. These devices are used in communication systems or telecommunication networks such as Global System for Mobile Communications (GSM), General Packet Radio Service (GPRS) or Enhanced Data Rate for GSM Evolution (EDGE) networks. Existing ways of changing or adjusting a clock signal frequency result in signals with inaccurate and shifting duty cycles that are difficult to control. This is in part because existing techniques for adjusting clock signal frequency are susceptible to operationally significant temperature and voltage fluctuations. In addition, conventional frequency multipliers have high current and power requirements, and are physically large circuits, making compact and efficient placement on computer chips impractical.

SUMMARY OF THE INVENTION

Aspects and embodiments of the present invention are directed to frequency multipliers and circuits adapted to change the frequency of an input signal. These frequency multipliers can generate multiple clock signals of different frequencies from a source signal. Embodiments are capable of low power operations and being implemented with digital circuitry, resulting in circuits having lower power requirements and a small footprint. The small size and low power consumption of these circuits make them suitable for use in space or power constrained devices such as mobile telephone handsets, personal digital assistants (PDAs), and the like.

At least one aspect is directed to a frequency multiplier circuit. The frequency multiplier circuit can include a plurality of serially connected delay elements that are configured to generate a plurality of delay tap signals from an input signal. The frequency multiplier circuit can also include a phase detector configured to receive a first selected delay tap signal and the input signal. The phase detector can detect a phase shift between the first selected delay tap signal and the input signal, and can generate a phase detection signal indicative of a value of the phase shift. The frequency multiplier circuit can include a digital logic gate configured to receive the input signal and a second selected delay tap signal. The digital logic gate can be further configured to generate an output signal responsive to the second selected delay tap signal and the input signal. The frequency multiplier circuit can also include a controller coupled to the phase detector and coupled to an output gate. The controller can be configured to receive the phase detection signal and to enable the output gate when the value of the phase shift corresponds to a predetermined value. The output gate can provide the output signal when enabled.

At least one other aspect is directed to a method of providing a clock signal. The method receives an input signal and can generate a plurality of delay tap signals from the input signal. The method detects a phase shift between the input signal and a first delay tap signal, and selects a second delay tap signal based at least in part on a value of the phase shift. The method can generate the clock signal responsive to the input signal the second delay tap signal, and can enable an output responsive to the phase shift having a predetermined value. The method can also provide the clock signal at the output.

At least one other aspect is directed to a frequency multiplier circuit that generates a digital output clock signal. The frequency multiplier circuit can include a plurality of connected delay elements. The delay elements are configured to produce a plurality of time delay tap signals from a digital input clock signal. A counter can be configured to identify a number of delay elements that produce a first time delay tap signal indicative of a first phase shift of the digital input clock signal. The counter can be further configured to identify, based at least in part on the number of delay elements that produce the first time delay tap signal, a second delay tap signal indicative of a second phase shift in the digital input clock signal. The frequency multiplier circuit includes means for generating the digital output clock signal responsive to the digital input clock signal and the second delay tap signal. A controller can be coupled to the counter and configured to enable a frequency multiplier circuit output responsive to the first phase shift having a predetermined value. The frequency multiplier circuit output can be configured to provide the digital output clock signal.

Various embodiments of these aspects may include a counter configured to generate a first counter signal indicative of a first number of delay elements that produce a first selected delay tap signal. The counter can also be configured to produce a second counter signal indicative of a second number of delay elements that produce a second selected delay tap signal. At least one multiplexor, coupled to a phase detector, a digital logic gate, a counter, and a plurality of serially connected delay elements, can be configured to receive a plurality of delay tap signals, a first counter signal, and a second counter signal. The multiplexor may select a first selected delay tap signal and provide it to the phase detector. The multiplexor may also select a second selected delay tap signal and provide it to a digital logic gate. The frequency multiplier circuit may form part of a transceiver of a mobile telephone configured for communication through a network, such as any of a Global System for Mobile Communications (GSM), a General Packet Radio Service (GPRS), or an Enhanced Data Rate for GSM Evolution (EDGE) network, for example.

Still other aspects, embodiments, and advantages of these exemplary aspects and embodiments are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF THE DRAWINGS

Various aspects of at least one embodiment are discussed below with reference to the accompanying figures. In the figures, which are not intended to be drawn to scale, each identical or nearly identical component that is illustrated in various figures is represented by a like numeral. For purposes of clarity, not every component may be labeled in every drawing. The figures are provided for the purposes of illustration and explanation and are not intended as a definition of the limits of the invention. In the figures.

DETAILED DESCRIPTION

Various aspects and embodiments are directed to frequency multiplier circuits with automatic calibration features. As discussed further below, a frequency multiplier circuit may use one or more delay elements to generate a signal that is phase shifted with respect to the input signal. This phase shifted signal can be combined with the input signal to generate an output signal with a frequency that is a multiple of the input signal, for example, double the frequency of the input signal, as discussed further below. The magnitude of the phase shift in the phase shifted signal relative to the input signal can be controlled, as discussed below, so as to generate the output signal with a certain desired frequency and also with a controlled duty cycle. Digital implementation of the frequency multiplier circuit, as discussed below, reduces both power requirements and the area occupied by the frequency multiplier circuit.

It is to be appreciated that embodiments of the methods and apparatuses discussed herein are not limited in application to the details of construction and the arrangement of devices set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

Figure 1:
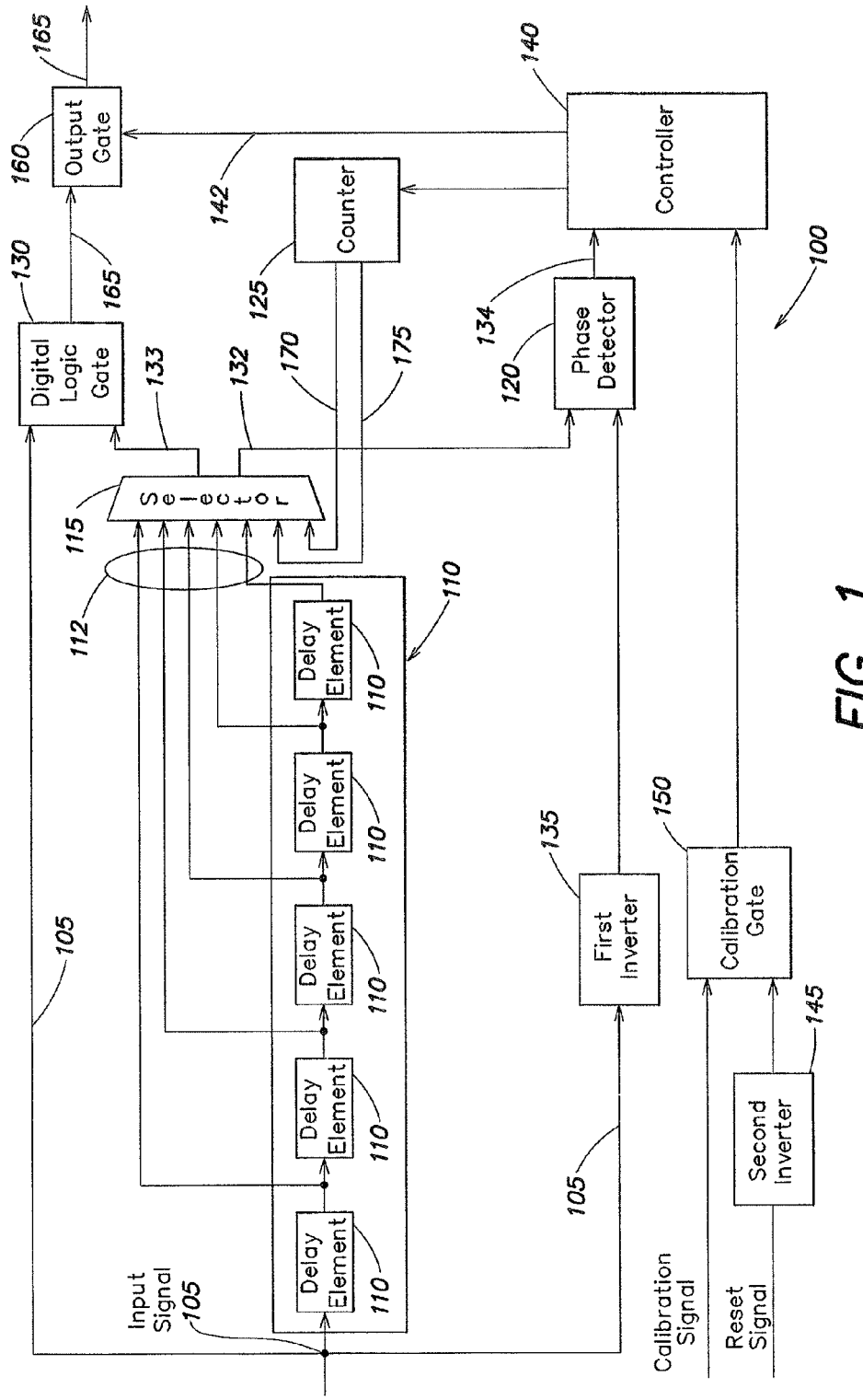
FIG. 1 is a block diagram depicting one example of a frequency multiplier circuit in accordance with aspects of the invention.

Referring to FIG. 1, there is illustrated a block diagram depicting one example of a frequency multiplier circuit 100 in accordance with aspects of the invention. In one embodiment, frequency multiplier circuit 100 includes at least one input for receiving an input signal 105. The input signal may be processed by a plurality of delay elements 110 to generate multiple delay tap signals 112 of input signal 105, as discussed further below. The frequency multiplier may include at least one selector 115 that can receive the delay tap signals 112 and provide at least one selected delay tap signal to a phase detector 120 and to a digital logic gate 130. As discussed below, phase detector 120 may receive a first selected delay tap signal 132 and digital logic gate 130 may receive a second selected delay tap signal 133. Phase detector 120 may provide a phase detection signal 134 to controller 140. Phase detection signal 134, as discussed below, may indicate a value of a phase shift of first selected delay tap signal 132 relative to input signal 105. Controller 140 may couple with counter 125 to associate at least one delay element 110 with a delay tap signal 112 having a phase shift corresponding to a predetermined value. Counter 125 may maintain information indicating that, for example, a $n^{th}$ serially connected delay element 110 provides a delay tap signal 112 having a 180 degree phase shift. As discussed below, selector 115 may provide second delay tap signal 133 to digital logic gate 130, where it may be combined with input signal 105 to generate output signal 165. Output signal 165, may be provided to output gate 160, where enablement signal 142, provided for example by controller 140, may enable the output of output signal 165 from output gate 160.

As discussed above, the frequency multiplier circuit may be used to generate clock signals in a digital circuit. Accordingly, in one example, input signal 105 may include a digital clock signal having a particular frequency, period, and duty cycle. A crystal such as a quartz crystal or a piezoelectric resonator may generate input signal 105. In one example, input signal 105 includes a signal having a frequency between, for example, about 24 MHz and 28 MHz. However, it is to be appreciated that characteristics of input signal 105, such as frequency, may vary widely from this range and that input signal 105 may include a variety of oscillating signals, such as any square wave signals or pulses, for example. In one embodiment, frequency multiplier circuit 100 can be located on a transceiver chip and input signal 105 can be generated by a crystal clock signal generator that can also be located on the transceiver chip.

Still referring to FIG. 1, in one embodiment, frequency multiplier circuit 100 includes a plurality of delay elements 110. Delay elements 110 may be serially connected where an initial delay element 110 receives input signal 105 and each subsequent delay element 110 receives as its input the output from the previous delay element 110, as illustrated in FIG. 1. Each delay element 110 introduces a specified delay to the signal received at its input, and provides an output signal that is therefore phase shifted with respect to the received input signal. The plurality of delay elements 110 thus may provide a plurality of delay tap signals 112, each delay tap signal 112 being phase shifted with respect to adjacent delay tap signals 112 by a specified amount determined by the delay added by the respective delay element 110. In the series configuration illustrated in FIG. 1, each sequential delay tap signal 112 is further phase shifted with respect to the input signal 105. In one embodiment, the plurality of delay elements 110 may be substantially identical and therefore add substantially the same delay or phase shift to the signal received at its input. Accordingly, if there are N delay elements 110 and the phase shift caused by each delay element 110 is x degrees, then the plurality of delay elements 110 generate N delay tap signals 112, each delay tap signal 112 being phase shifted with respect to the input signal 105 by k*x degrees, where k is the number of delay elements 110 used to produce the respective delay tap signal 112. For example, the third delay element 100 in the series may generate a delay tap signal 112 that is phase shifted by 3x degrees relative to the input signal 105, and the $k^{th}$ delay element 110 generates a delay tap signal 112 that is phase shifted by kx degrees relative to the input signal 105.

Figure 2:
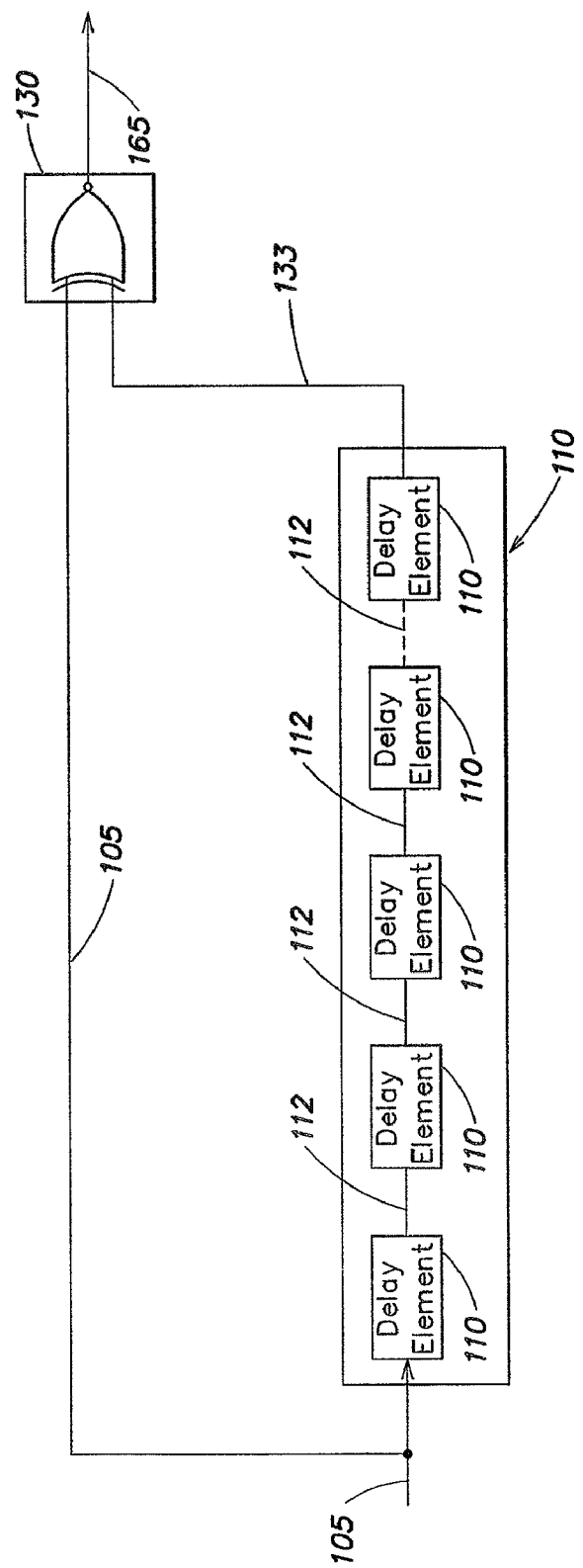
FIG. 2 is a block diagram depicting examples of a frequency multiplier circuit in accordance with aspects of the invention.

FIG. 2 is a block diagram depicting an example of a frequency multiplier circuit 100 in accordance with aspects of the invention. With reference to FIG. 1 and FIG. 2, input signal 105 cascades through a plurality of delay elements 110. Each delay element 110 generally introduces a delay to input signal 105. In one embodiment, a delay tap signal 112 from a delay element 110 can be provided to digital logic gate 130 to generate an output signal 165. In one embodiment, delay tap signal 112 can be second selected delay tap signal 133. By combining input signal 105 with delay tap signal 112 that is phase shifted from input signal 105, output signal 165 can have a frequency greater than a frequency of input signal 105. In various embodiments, any delay element 110 can provide delay tap signal 112 to, for example, digital logic gate 130 for combination with input signal 105 to produce output signal 165.

It is to be appreciated that the number of delay elements 110 that form part of frequency multiplier circuit 100 may vary. In one embodiment, the plurality of delay elements 110 includes 128 delay elements, although other numbers of delay elements 110 that may or may not be factors of the number 2 are suitable as well. The number of delay elements 110 used may depend on the total phase shift desired between the last delay tap signal 112 and the input signal 105 and on the desired resolution. For example, 128, or any other number, of delay elements 110 may collectively provide a delay tap signal 112 with a phase shift within a desired range, such as from 175 to 185 degrees. Increasing or decreasing the number of delay elements 110 may narrow or broaden this range. For example, 360 substantially equal delay elements 110 may produce 360 delay tap signals 112, each having a phase shift of one degree with respect to a signal received as input. If, for example, frequency multiplier circuit 100 includes 36 substantially equal delay elements 110, each delay element 110 may generate a delay tap signal 112 having a 10 degree phase shift with respect to a signal received as input. In addition, in one embodiment, frequency multiplier circuit 100 can include a single delay element 110. For example, a single delay tap element 110 can receive input signal 105 and produce a plurality of delay tap signals 112, where each delay tap signal 112 can be phase shifted by a different amount with respect to input signal 105.

It is further to be appreciated that the phase shifts produced by each delay element 110 need not be the same. Generally, delay elements 110 can introduce phase shifts of any degree to any signal to which they are coupled. For example, a first delay element 110 can generate a first delay tap signal 112 with a phase shift of x degrees relative to input signal 105, and a second delay element 110 can receive the first delay tap signal 112 and produce a second delay tap signal 112 with a y degree phase shift relative to the first delay tap signal 112. Various combinations of delay elements 110 can provide a series of delay tap signals 112 with various different phase shifts, allowing flexibility in producing the output signal. In one embodiment, at least one delay element 110 can produce a delay tap signal 112 with a phase shift of substantially 180 degrees relative to input signal 105, as discussed further below.

According to one embodiment, the plurality of delay tap signals 112 may be fed to at least one selector 115. Selector 115 may be coupled to at least one phase detector 120, at least one counter 125, and at least one digital logic gate 130, as discussed above. Selector 115 generally receives delay tap signals 112 and provides first selected delay tap signal 132 to phase detector 120, and provides second selected delay tap signal 133 to digital logic gate 130. In one embodiment, selector 115 receives the plurality of delay tap signals 112 and sequentially provides them as first selected delay tap signal 132 to phase detector 120. When a first selected delay tap signal 132 is recognized, for example by controller 140, to have a phase shift corresponding to a predetermined value, controller 140 may direct counter 125 to provide first counter signal 170 to selector 115. In this example, now that a particular delay tap signal 112 having a desired phase shift has been identified, first counter signal 170 may instruct selector 115 to continuously provide that particular delay tap signal 112 to phase detector 120 as first selected delay tap signal 132. In this illustrative embodiment, counter 125 can also provide second counter signal 175 to selector 115 that identifies a delay tap signal 112 to be selected as second selected delay tap signal 133.

In one embodiment, selector 115 may include at least one multiplexor. As known to those skilled in the art, a multiplexor receives a plurality of signals as input, and provides at least one of the received signals as output. For example, selector 115 may include a multiplexor configured to receive the plurality of delay tap signals 112 from delay elements 110 and to provide a first selected delay tap signal 132 to phase detector 120.

Figure 3:
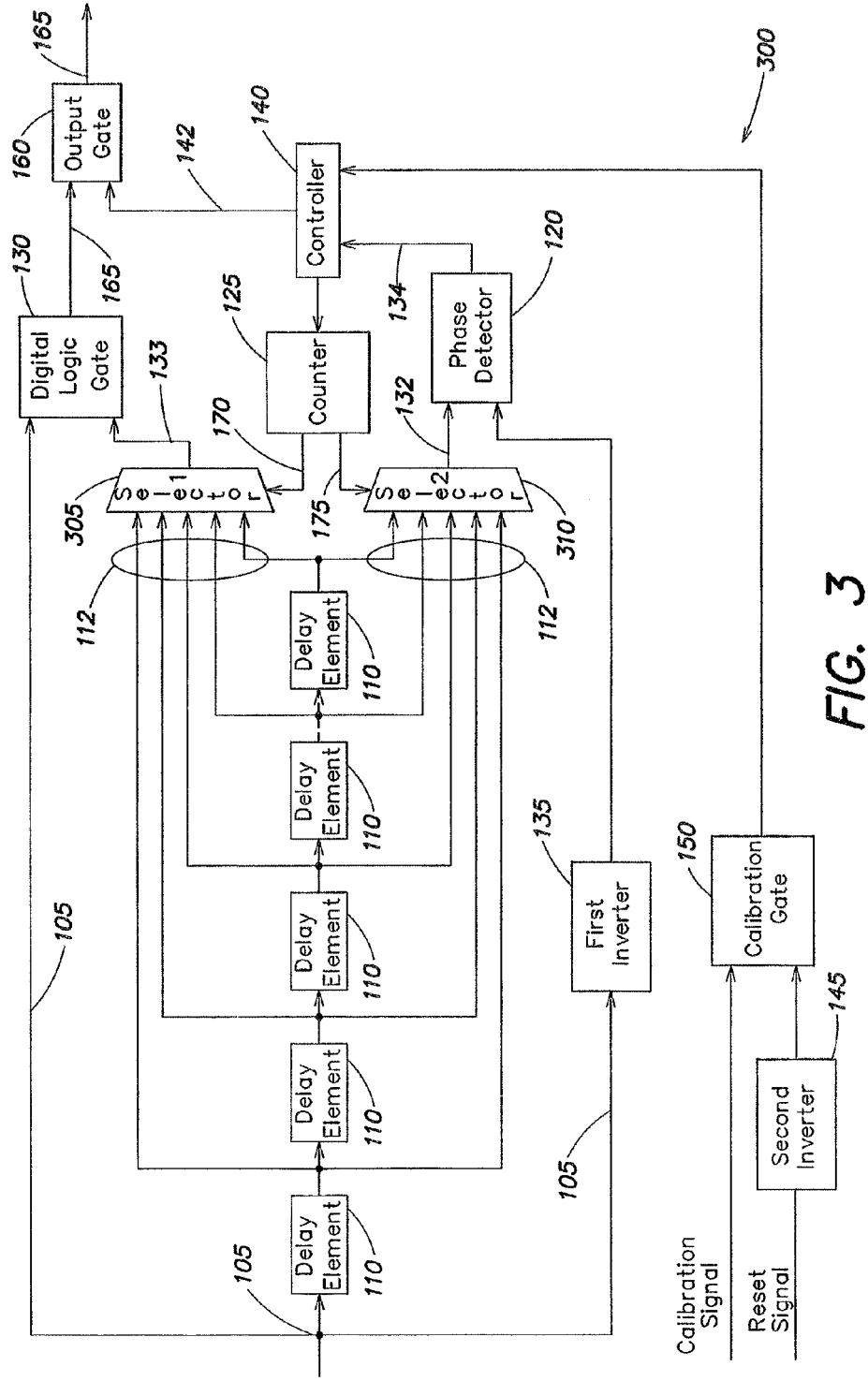
FIG. 3 is a block diagram depicting an example of a frequency multiplier circuit in accordance with aspects of the invention.

Frequency multiplier circuit 100 may include more than one selector 115. For example, FIG. 3 is a block diagram depicting an example of a frequency multiplier circuit 300 in accordance with aspects of the invention. Frequency multiplier circuit 300 may include first selector 305 and second selector 310, which may, for example, include at least one multiplexor. In one embodiment, at least one of first selector 305 and second selector 310 can form part of selector 115. As illustrated in FIG. 3, second selector 310 may be coupled to the plurality of delay elements 110, phase detector 120, and counter 125. Second selector 310 may be configured to provide first selected delay tap signal 132 to phase detector 120. For example, second selector 310 may receive second first counter signal 175 from counter 125 identifying at least one delay element 110 that generates a delay tap signal with a phase shift corresponding to a predetermined value. In one embodiment, second selector 310 selects, as first selected delay tap signal 132, a delay tap signal generated by the delay element 110.

In one embodiment, first selector 305 may be coupled to the plurality of delay elements 110, counter 125, and digital logic gate 130. First selector 305 may be configured to provide second selected delay tap signal 133 to digital logic gate 130. For example, first selector 305 may receive first counter signal 170 from counter 125 identifying at least one delay element 110 that generates second selected delay tap signal 133. In one embodiment, first selector 305 selects, as second selected delay tap signal 133, a delay tap signal generated by the identified delay element 110. First selector 305 may then provide second selected delay tap signal 133 to digital logic gate 130.

For example a $n^{th}$ delay element 110 may provide a delay tap signal 112 with, for example a 180 degree phase shift with respect to input signal 105. In one embodiment, selector 115 may select at least one delay tap signal 112 having a phase shift and provide this delay tap signal 112 as first selected delay tap signal 132 to phase detector 120. In the next iteration, selector 115 may select at least one other delay tap signal 112 as first selected delay tap signal 132 to provide to phase detector 120. Continuing with this example, phase detector 120 can sequentially receive, as first selected delay tap signal 132, each delay tap signal 112 as it is provided over time by delay elements 110. Phase detector 120 may then generate at least one phase detection signal 134 corresponding to each selected delay tap signal. Phase detection signals 134 generally indicate a value of a phase shift associated with a delay tap signal 112 produced by at least one delay element 110. In one embodiment, these iterations may continue until selector 115 selects a delay tap signal 112 having a phase shift corresponding to a predetermined value. Continuing with this illustrative embodiment, if the predetermined value is 180 degrees, selector 115 can, on the $n^{th}$ iteration, provide, as first selected delay tap signal 132, a delay tap signal 112 generated by a $n^{th}$ delay element 110.

In a further illustrative embodiment, input signal 105 may cascade through the plurality of serially connected delay elements 110 that may each produce at least one delay tap signal 112, as described above. Selector 115 can receive the plurality of delay tap signals 112 and provide one of them as first selected delay tap signal 132 to phase detector 120. Phase detector 120 may determine if first selected delay tap signal 132 is phase shifted by a predetermined amount. If the phase shift of first selected delay tap signal 132 matches a predetermined amount, frequency multiplier circuit 100 can enable output gate 160.

As discussed above, in one embodiment, the frequency multiplier includes a phase detector 120 configured to receive at least one delay tap signal 112 generated by a delay element 110. This may include a delay tap signal 112 having a phase shift substantially equal to a predetermined value, such as 180 degrees, for example. In one embodiment, phase detector 120 receives input signal 105. In another embodiment, phase detector 120 receives input signal 105 after input signal 105 passes through one or more digital logic gates or programmable gate arrays, such as first inverter 135. Phase detector 120 may include a logic device such as a set/reset flip-flop, DQ flip-flop, JK flip-flop or master/slave flip flop. In one embodiment, phase detector 120 can be configured to receive first selected delay tap signal 132 generated by a delay element 110 as well as input signal 105, and to generate phase detection signal 134. In one embodiment, phase detection signal 134 generated by phase detector 120 indicates a value of a phase shift of a delay tap signal 112 with respect to input signal 105. For example, phase detector 120 may provide phase detection signal 134 indicating that one of a plurality of delay tap signals 112 is phase shifted by any number of degrees with respect to input signal 105.

Frequency multiplier circuit 100 may include at least one controller 140. Controller 140 may include at least one logic device, such as a processor having sufficient processing power to perform the logic operations described herein. For example, controller 140 may include at least one programmable or field programmable gate array configured to receive phase detection signal 134 and to output signals for further processing. In one embodiment, controller 140 can receive at least one phase detection signal 134 from phase detector 120 and at least one calibration signal. The calibration signal may be provided to frequency multiplier circuit 100, and the calibration signal may be subject to logic operations by, for example, programmable gate arrays or other logic devices such as at least one of second inverter 145 and calibration gate 150, which in one embodiment can include at least one OR gate.

In one embodiment, controller 140 may transition frequency multiplier circuit 100 from a calibration state to an operational state by enabling output gate 160. In one embodiment and with reference to FIG. 4, frequency multiplier circuit 100 cycles through a calibration mode of operation 405 when it is activated or turned on. In calibration mode 405, the output of the frequency multiplier circuit 100 can be disabled, so that it does not provide a spurious output signal to subsequent circuit elements. Output gate 160 may include a programmable logic array or other logic device. In one embodiment, output gate 160 includes a logic device having at least one AND gate. Controller 140 may couple with phase detector 120 and output gate 160 so that controller 140 receives phase detection signals 134 from phase detector 120 and enables output gate 160 when a value of a phase shift, as indicated in the phase detection signal, corresponds to a predetermined value. When phase detection signal 134 corresponds to a predetermined value, one of the plurality of delay elements 110 may provide a delay tap signal 112 having a desired phase shift.

In one embodiment, controller 140 can provide and output gate 160 can receive enablement signal 142 that may prevent frequency multiplier circuit 100 from applying output signal 165. Output signal 165 may be provided by output gate 160 upon receipt of enablement signal 142. Output signal 165 may include an XOR combination, for example by digital logic gate 130, of input signal 105 and second selected delay tap signal 133. In one embodiment, digital logic gate 130 generates output signal 165 that is phase shifted by approximately 90 degrees with respect to input signal 105. This can result in output signal 165 having about a 50% duty cycle and a frequency of about double that of input signal 105. Although not shown in FIG. 1, output gate 160 may also include at least one output multiplexor adapted to receive at least one bypass clock signal and to provide output signal 165. In one embodiment, the bypass clock may provide input signal 105 directly to output gate 160, thus bypassing delay elements 110.

Although not shown in FIG. 1, controller 140 may receive at least one skew calibration signal. For example, controller 140 may receive at least one skew calibration signal including software control bits to tune a frequency of output signal 165, which can skew the duty cycle of output signal 165 by, for example, +/−5%. For example, the skew calibration signal may adjust the duty cycle of output signal 165 by introducing positive or negative delay to output signal 165.

Operation of the frequency multiplier circuit 100 may be described in terms of a finite state machine. For example, referring to FIG. 4, frequency multiplier circuit 100 may transition between states of operation based at least in part on phase shifts between delay tap signals 112 and input signal 105. In one embodiment, frequency multiplier circuit 100 can remain in one state until phase detector 120 generates a value of a phase shift that corresponds to a predetermined value. In one embodiment, a delay tap signal 112 having a desired phase shift relative to input signal 105 can be identified, and frequency multiplier circuit 100 can transition to another state. In various embodiments, controller 140 may also include software control bits configured to delay input signal 105, or to reset frequency multiplier circuit 100, for example.

Figure 4:
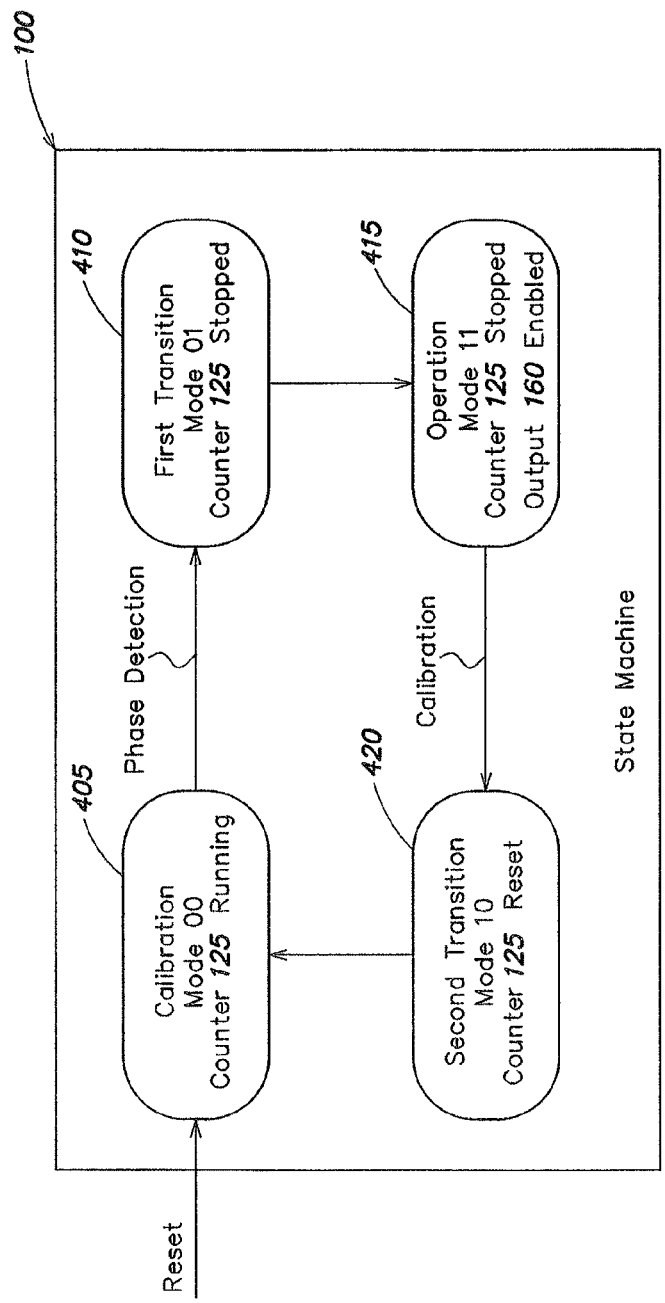
FIG. 4 is a block diagram depicting examples of modes of operation of a frequency multiplier circuit in accordance with aspects of the invention.

In one embodiment, the states of frequency multiplier circuit 100 are illustrated in FIG. 4, which is a block diagram depicting examples of modes of operation of frequency multiplier circuit 100 in accordance with aspects of the invention. In one embodiment, frequency multiplier circuit 100 includes two main states of operation, at least one calibration mode 405, at least one first transition mode 410, at least one operation mode 415, and at least one second transition mode 420. In calibration mode 405, input signal 105 may cascade through a plurality of serially connected delay elements 110 until phase detection signal 134 indicates a delay tap signal 112 having a phase shift corresponding to a predetermined value, at which point phase detection signal 134 may change states, (e.g., switch from logic 1 to logic zero.) In one embodiment, calibration mode 405 occurs after start-up or reset of a frequency multiplier circuit, before output signal 165 is provided as output from frequency multiplier circuit 100.

With reference to FIGS. 1 and 4, in one embodiment, when frequency multiplier circuit 100 operates in calibration mode 405, counter 125 keeps track of a number of delay elements 110 whose delay tap signals 112 have been provided to phase detector 120. In calibration mode 405, at least one second counter signal 175 may be disabled so that second selected delay tap signal 133 may not be provided to digital logic gate 130. In calibration mode 405, enablement signal 142 may also disable output gate 160, for example by providing a logic-low signal (e.g., a zero) to output gate 160.

In one embodiment, when phase detection signal 134 changes states, indicating for example that first selected delay tap signal 132 has a phase shift corresponding to a predetermined value, a frequency multiplier circuit may enter first transition mode 410, at which point counter 125 may stop its count of delay elements 110 upon identification of at least one particular delay element 110 associated with first selected delay tap signal 132 having a desired phase shift. In first transition mode 410, counter 125 may enable second counter signal 175 so that selector 115 selects second selected delay tap signal 133. When enablement signal 142 switches states, for example from low to high, frequency multiplier circuit 100 may proceed to move from first transition mode 410 to operation mode 415. In operation mode 415, enablement signal 142 allows output gate 160 to pass output signal 165. In one embodiment, enablement signal 142 may switch states and controller 140 may enable output gate 160 upon switching, for example, from a logic zero to a logic one.

In one embodiment, at least one enablement calibration signal may be provided. When, for example, the enablement calibration signal switches states, frequency multiplier circuit 100 may begin a transition from operation mode 415 back to calibration mode 405 by entering second transition mode 420. In second transition mode 420, enablement signal 142 may switch states relative to its operation mode 415 state. For example, enablement signal 142 may switch from a logic one to a logic zero, disabling output gate 160 and preventing output signal 165 from passing as output from frequency multiplier circuit 100. It should be appreciated that in one embodiment output signal 165 is provided only in operation mode 415.

In one embodiment in calibration mode 405 enables counter 125, which can control the operation of selector 115 so that selector 115 selects a plurality of delay tap signals 112 as first selected delay tap signal 132. For example, selector 115 output, (e.g. first selected delay tap signal 132) can get updated each input signal 105 clock cycle as input signal 105 cascades or ripples through a plurality of delay elements 110. In one embodiment, selector 115 output can be sampled with at least one falling edge of input signal 105. In one embodiment, when a sample register detects a logic zero (or other change,) in selector 115 output, a delay corresponding to a 180 degree phase shift relative to input signal 105 has been identified. At this point, in this example, frequency multiplier circuit 100 may transition from calibration mode 405 to operation mode 415.

For example, if the phase shift of first selected delay tap signal 132 matches a predetermined amount, frequency multiplier circuit 100 can enable output gate 160 and transition from calibration mode 405 to operation mode 415. If not, frequency multiplier circuit 100 can continue in calibration mode 405 and another delay tap signal 112 can be selected by selector 115 and provided to phase detector 120. In one embodiment, frequency multiplier circuit 100 remains in calibration mode 405, with output gate 160 disabled when phase detector 120 cycles through first selected delay tap signals 132, and transitions to operation mode 415 when a delay tap signal 112 with a phase shift matching a predetermined value is identified.

Continuing with this illustrative embodiment, a 180 degree phase shift may be determined. To generate output signal 165 with approximately a 50% duty cycle and approximately twice the frequency of input signal 105, frequency multiplier circuit 100 may proceed to identify a delay tap signal 112 with a 90 degree phase shift. For example, during transition from calibration mode 405 to operation mode 415 via first transition mode 410, at least one first counter signal 170, which corresponds to a number of delay elements 110 that provide a delay tap signal 112 with a 180 degree phase shift, can be divided in half, for example by use of a right shift function. In this example, second counter signal 175 may include this shifted counter value used by selector 115 to select second selected delay tap signal 133. In one embodiment, upon selection of second selected delay tap signal 133, frequency multiplier circuit 100 transitions to operation mode 415, enabling output of output signal 165. For example, second selected delay tap signal 133 may be provided to digital logic gate 130 together as input with input signal 105. This generates output signal 165 operating at approximately twice the frequency of input signal 105, and having approximately a 50% duty cycle.

Phase detector 120 may provide first phase detection signal 134 that indicates that one of delay elements 110 can provide a delay tap signal 112 with a phase shift relative to input signal

105. This phase detection signal 134 may be provided to counter 125, for example via controller 140. In an embodiment including a plurality of serially connected delay elements 110, counter 125 can maintain information identifying a number of delay elements 110 that produced phase detection signal 134. In one embodiment where delay elements 110 may not be serially connected, counter 125 can identify at least one delay element 110 that produces phase detection signal 134. Counter 125 may include memory to store data indicating that the first delay element 110 provides a delay tap signal 112 that is phase shifted by x degrees with respect to input signal 105. In a next iteration of this illustrative embodiment, a subsequent phase detection signal 134 may indicate that another delay element 110 provides another delay tap signal 112 with, for example, a x+y degree phase shift relative to input signal 105. In this illustrative embodiment, this delay tap signal 112 may then be provided, as first selected delay tap signal 132, to phase detector 120, where phase detection signal 134 associating one delay element 110 with a x+y degree phase shift relative to input signal 105 can be provided to counter 125.

It should be appreciated that counter 125 generally maintains information identifying a number of delay elements 110 used to provide delay tap signals 112 having various phase shifts relative to input signal 105. In the example where each delay element 110 introduces a further phase shift to each delay tap signal 112, counter 125 can identify which delay element 110 corresponds to which phase shift. In this example and with respect to input signal 105, at least one delay element 110 can be associated with a delay tap signal 112 having a x degree phase shift, another delay tap signal 112 can be associated with a x+y degree phase shift, and so on so that, for example, the $n^{th}$ delay element 110 can be associated with, for example, a 180 degree phase shift. Generally, delay elements 110 may introduce phase shifts of varying degrees to an input signal.

In one embodiment of this example, a selected delay tap signal 112 with a phase shift of approximately 180 degrees includes any phase shift between 170 and 190 degrees. In one embodiment, a phase shift of approximately 180 degrees includes a phase shift of between 177 and 183 degrees, and approximately a 90 degree phase shift includes an 88 to 92 degree phase shift. Further variations of approximate ranges, both broader and narrower, are possible. Generally, any range relative to an exact value that does not substantially degrade operation of frequency multiplier circuit 100 as compared to its operation at an exact predetermined value is approximately the predetermined value.

Figure 5:
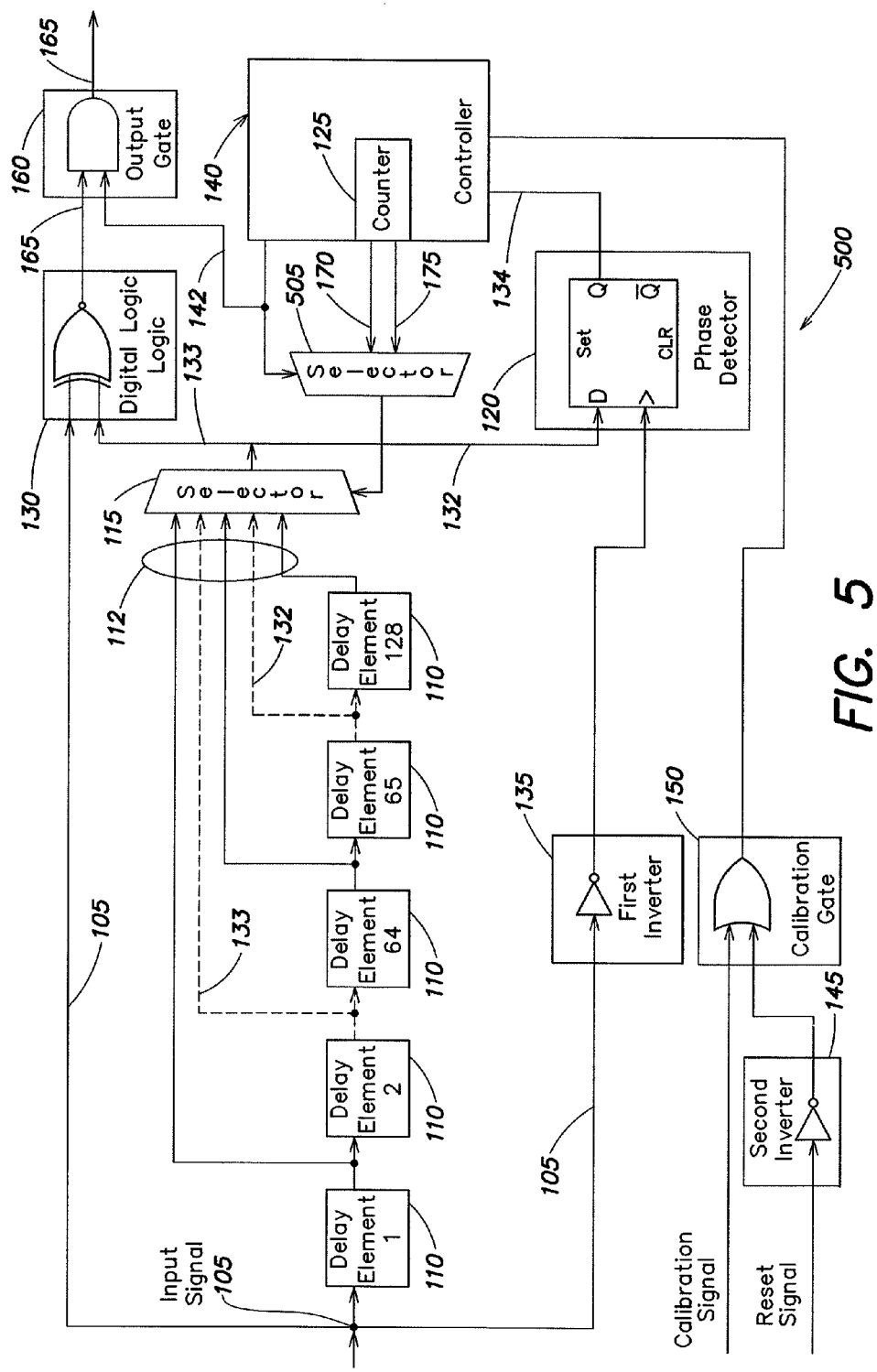
FIG. 5 is a block diagram depicting an example of a frequency multiplier circuit in accordance with aspects of the invention.

Counter 125, which can associate phase shifts of each delay tap signal 112 with at least one delay element 110 that provided each phase shift, may generate counter signals that can identify which delay element 110 provided which delay tap signal 112. For example, counter 125 may generate or provide at least one first counter signal 170 indicative of a first number of delay elements 110 that produce first selected delay tap signal 132 and at least one second counter signal 175 indicative of a second number of delay elements 110 that produce a second selected delay tap signal 133. With reference to FIG. 1 and FIG. 5, the latter of which is a block diagram depicting an example of a frequency multiplier circuit 500 in accordance with aspects of the invention. Frequency multiplier circuit 500 may include at least one counter selector 505. In one embodiment, counter selector 505 includes a multiplexor that can receive first counter signal 170 and second counter signal 175 and provide at least one of these signals to multiplexor 115.

In one embodiment, counter selector 505 may receive at least one of a frequency calibration signal and a control calibration signal. For example, the control calibration signal may provide a delay value used to generates at least one of first selected delay tap signal 132 and second selected delay tap signal 133. In one embodiment, although not depicted in FIG. 5, a frequency calibration signal may enable counter selector 505. When enabled, counter selector 505 may provide the control calibration signal, as second counter signal 175, to selector 115. Based on second counter signal 175, selector 115 may provide second selected delay tap signal 133 to digital logic gate 130.

In one embodiment, counter 125 may maintain data indicating that a $n^{th}$ serially connected delay element 110 may provide a delay tap signal 112 having a 180 degree phase shift relative to input signal 105. In this illustrative embodiment, where for example a predetermined value of a phase shift is 180 degrees, and where at least one delay element 110 providing a 180 degree phase shift has been detected, controller 140 may enable output gate 160. Continuing with this example, counter 125 may generate first counter signal 170 indicating that the $n^{th}$ delay element 110 provides a delay tap signal 112 having a phase shift that corresponds to a predetermined value, 180 degrees in this example. Counter 125 may also generate second counter signal 175 that indicates a second number of delay elements 110 that produce a second selected delay tap signal 133.

It should be appreciated that the numbers used in the illustrative embodiments herein are examples that do not limit the operation of frequency multiplier circuit 100. For example, any number of delay elements 110 can produce a phase shift corresponding to any predetermined value from, for example, zero to 360. Delay elements 110 may, but need not be serially connected as illustrated in FIG. 1. Other configurations are possible. For example, a single delay element 110 can produce, provide, or generate a plurality of delay tap signals 112 at a plurality of different phases, one of which may be selected as first selected delay tap signal 132, and one of which may be selected as second selected delay tap signal 133. Counter 125 may perform various logic operations to deduce a number of delay elements 110 that produce a delay tap signal 112 that can be selected as a second selected delay tap signal 133, and counter 125 may, but need not perform a divide by two operation. Generally any logic operation that enables detection of second selected delay tap signal 133 having a phase shift with respect to input signal 105 may be implemented.

When enabled, frequency multiplier circuit 100 may provide output signal 165 from output gate 160. For example, counter 125 may generate first counter signal 170 indicating that the $n^{th}$ delay element produces a delay tap signal 112 with a desired phase shift. This first counter signal 170, indicating which delay element 110 produces a desired delay tap signal 112, can be received by multiplexor 115. Selector 115 may respond by providing, as first selected delay tap signal 132 to phase detector 120, the delay tap signal 112 corresponding to a 180 degree phase shift. In this illustrative embodiment, once a delay tap signal 112 with a phase shift matching a predetermined value has been identified, phase detector 120 may receive, during a plurality of input signal 105 clock cycles, as first selected delay tap signal 132, the delay tap signal 112 corresponding to a desired (e.g., 180 degree) phase shift.

Figure 6:
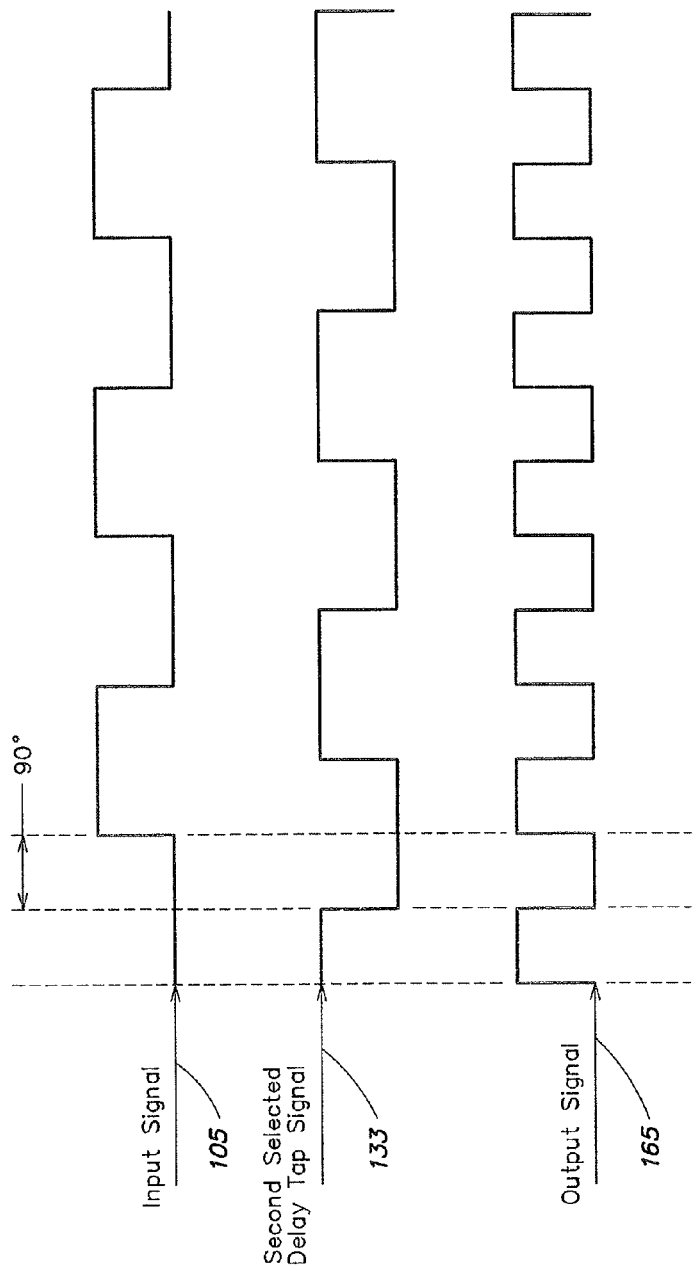
FIG. 6 is a timing diagram depicting an example of frequency multiplier circuit signals in accordance with aspects of the invention.

FIG. 6 is a timing diagram depicting an example of frequency multiplier circuit signals in accordance with aspects of the invention. With reference to FIG. 1 and FIG. 6, selector 115 provides second selected delay tap signal 133 to at least one digital logic gate 130. Digital logic gate 130 may include at least one programmable gate array. Digital logic gate 130 generally combines input signal 105 with second selected delay tap signal 133 to produce output signal 165 that may have a frequency greater than a frequency of input signal 105. In one embodiment, digital logic gate 130 includes at least one exclusive OR gate or at least one exclusive NOR gate, (i.e., XOR or XNOR) that combines input signal 105 and second selected delay tap signal 133 provided by selector 115 to produce output signal 165. It is appreciated that other logic gates can manipulate these signals to produce output signal 165. Each of input signal 105, delay tap signals 112, and output signal 165 can include a digital clock signal.

As illustrated in FIG. 6, second selected delay tap signal 133 is phase shifted by 90 degrees with respect to input signal 105, although phase shifts of other amounts are possible. In one embodiment, when digital logic gate 130 receives input signal 105 (e.g., a digital clock input signal) and second selected delay tap signal 133, (e.g., the digital clock input signal shifted by 90 degrees) output signal 165 can be produced that has approximately a 50% duty cycle and a frequency of approximately double the frequency of input signal 105. Output gate 160, such as an AND gate, may receive output signal 165, and may also receive an enablement signal 142 from controller 140 indicating that frequency multiplier circuit 100 may enter operational mode 415. In one embodiment, when output gate 160 receives both of these signals, frequency multiplier circuit 100 can be enabled, and output signal 165, may be provided as a clock signal from frequency multiplier circuit 100 to various electronic devices, such as elements that form part of a transceiver chip that may be part of a mobile phone or other device used to communicate through a network, such as at least one of a Global System for Mobile Communications (GSM) network, a General Packet Radio Service (GPRS) network, a Code Division Multiple Access Network, a Time Division Multiple Access Network, and an Enhanced Data Rate for GSM Evolution (EDGE) network.

First selected delay tap signal 132 and second selected delay tap signal 133 may correspond to delay tap signals 112 having different phase shifts relative to input signal 105. For example, first selected delay tap signal 132 may include the delay tap signal 112 provided by the $n^{th}$ delay element and having a phase shift of, for example, 180 degrees relative to input signal 105. In this example, counter 125 provides first counter signal 170 to selector 115 directing selector 115 to select, as first selected delay tap signal 132, the delay tap signal provided by the $n^{th}$ delay element 110. In one embodiment, output gate 160 is enabled when first selected delay tap signal 132 includes a delay tap signal 112 having a phase shift that corresponds to a predetermined value.

Continuing with this embodiment, when output gate 160 is enabled, frequency multiplier circuit 100 may transition to operation mode 415 and proceed to provide output signal 165. To do so, in this example, counter 125 may provide second counter signal 175 to multiplexor 115. Second counter signal 175 generally identifies at least one delay element 110 that provides a delay tap signal 112 that is selected by selector 115 as the second selected delay tap signal 133. The second selected delay tap signal 133 generally includes a delay tap signal 112 having a phase shift relative to input signal 105.

For example, if the $n^{th}$ delay element 110 provides a delay tap signal 112 having a phase shift corresponding to a predetermined value, then counter 125 may provide first counter signal 170 to selector 115 indicating to selector 115 that the delay tap signal 112 provided by the $n^{th}$ delay element 110 can be selected as the first selected delay tap signal 132. Continuing with this example, if the delay tap signal 112 generated by the $n^{th}$ delay element 110 has a 180 degree phase shift, counter 125 may identify at least one delay element 110 that generates a delay tap signal 112 having a 90 degree phase shift by identifying the $n^{th}/2$ delay element 110. The delay tap signal 112 generated by the $n^{th}/2$ delay element 110 may be provided by selector 115 to digital logic gate 130 as second selected delay tap signal 133. It should be appreciated that a delay element 110 that provides a delay tap signal 112 selected as second selected delay tap signal 133 can have different mathematical relationships with a $n^{th}$ delay element 110 that generates the delay tap signal 112 selected as the first delay tap signal 132, and need not always be the $n^{th}/2$ delay element 110. In one embodiment, counter 125 can generate second counter signal 175 by dividing in half the number of delay elements 110 that produce first selected delay tap signal 132 to arrive at a number of delay elements 110 that produce second selected delay tap signal 133. It should be appreciated that digitally detecting some phase shifts can be inefficient. For example, a falling edge of an input signal may not correspond to a logic state change of a signal having a 90 degree phase with respect to an input signal. Furthermore, a buffer delay introduced in an attempt to generate a 90 degree phase shift can vary with voltage and temperature fluctuations, resulting in output signals with unpredictable duty cycles.

In one embodiment, first selected delay tap signal 132 can include a delay tap signal 112 generated by an odd numbered $n^{th}$ element. For example, the $99^{th}$ delay element 110 may produce a delay tap signal 112 with a 180 degree phase shift. In one embodiment, to select second selected delay tap signal 133 with a 90 degree phase shift, the $n^{th}$ (e.g., $99^{th}$) serially connected delay element 110 can be divided by two and rounded to a nearest element. For example, second selected delay tap signal 133 may include a delay tap signal 112 produced by the either a $49^{th}$ or a $50^{th}$ delay element 110.

In one embodiment, frequency multiplier circuit 100 can be in calibration mode 405 when phase detector 120 receives first selected delay tap signal 132 that corresponds to a predetermined value. In this example, frequency multiplier circuit 100 may transition from calibration mode 405 to operation mode 415 and phase detector 120 may cease iterating through delay tap signals 112. Upon transition to operation mode 415, frequency multiplier circuit 100 can receive as first selected delay tap signal 132, the delay tap signal 112 having a phase shift corresponding to a predetermined value. When this occurs, frequency multiplier circuit 100 has identified a delay element 110 that provides a desired delay tap signal 112. In one embodiment, phase detector 120 can continually receive a selected delay tap signal 112 originating from a particular delay element 110 and controller 140 can enable output gate 160. With an enabled output gate 160, frequency multiplier circuit 100 can operate in operation mode 415 and may provide output signal 165 as, for example, an output clock signal.

In one embodiment, counter 125 can provide first counter signal 170 and second counter signal 175 to multiplexor 115. For example, first counter signal 170 may identify which delay tap signal 112 is to be selected by selector 115 as first selected delay tap signal 132 and provided to phase detector 120. Second counter signal 175 may identify which delay tap signal 112 is to be selected by selector 115 and provided to digital logic gate 130. Continuing with this example, first counter signal 170 may indicate that the delay tap signal 112 produced by any particular delay element 110 can be selected as first selected delay tap signal 132. At least one of counter 125 and controller 140 may process data indicating which delay element 110 produces first selected delay tap signal 132 to determine which delay element 110 produces second selected delay tap signal 133.

In one embodiment, frequency multiplier circuit 100 is transitioning or has transitioned to operational mode 415 when selector 115 provides second selected delay tap signal 133 to digital logic gate 130. Second selected delay tap signal 133 may have a known phase shift with respect to input signal 105, such as 90 degrees, for example. Second selected delay tap signal 133 may be referred to as a clock delay signal, as this signal may include input signal 105 delayed by any number of degrees by one or more delay elements 110. In one embodiment, input signal 105 can include a digital input clock signal and the second selected delay tap signal 133 can include a delayed clock signal that is, for example, approximately 90 degrees out of phase with the digital clock input signal.

Figure 7:
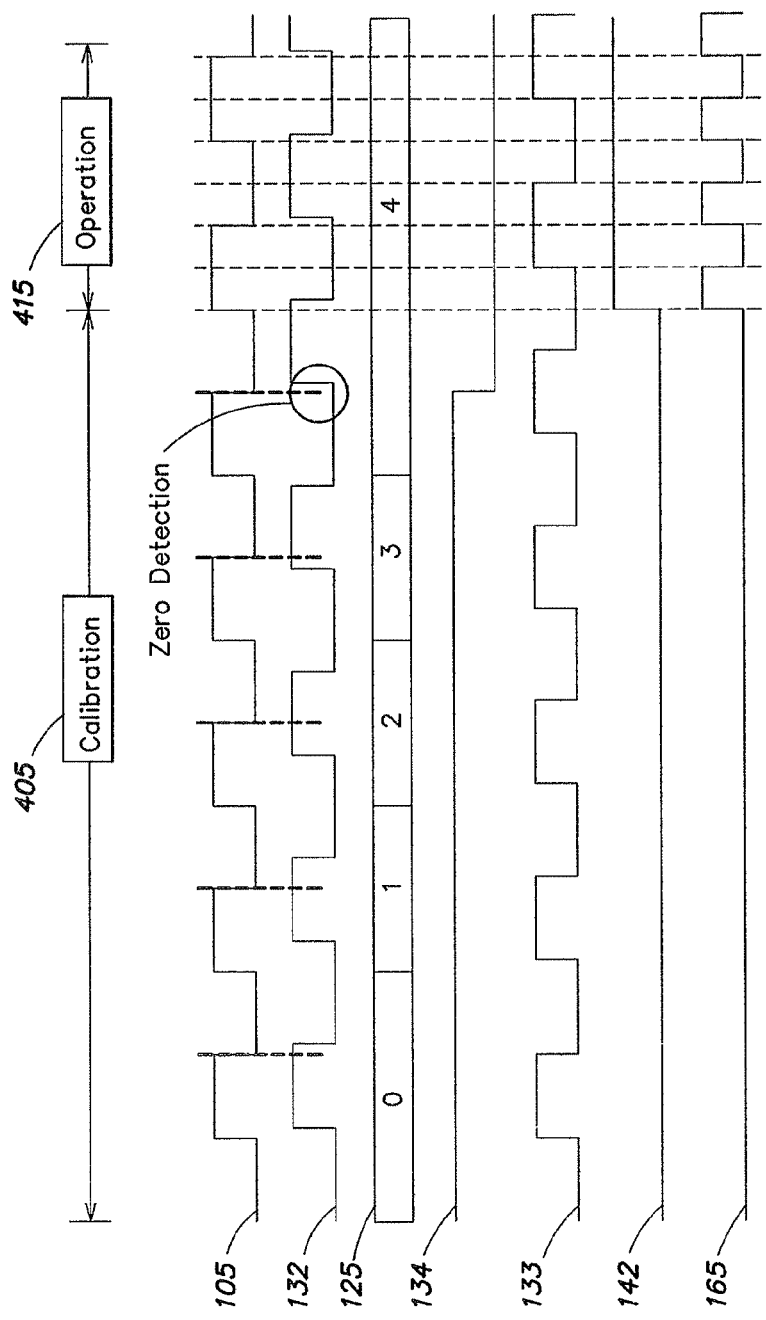
FIG. 7 is a timing diagram depicting an example of frequency multiplier circuit signals in accordance with aspects of the invention.

FIG. 7 is a timing diagram depicting an example of frequency multiplier circuit signals in accordance with aspects of the invention. As illustrated in FIG. 7, input signal 105 may be compared with first selected delay tap signal 132 to determine if a phase shift of first selected delay tap signal 132 corresponds to a predetermined value. In one embodiment, a 180 degree phase shift between input signal 105 and first selected delay tap signal 132 can be detected by sampling first selected delay tap signal 132 at successive falling edges of input signal 105. For example, detecting a zero, or logic-low, during a falling edge of input signal 105 indicates that first selected delay tap signal 132 is at least 180 degrees out of phase with respect to input signal 105. When a plurality of serially connected delay elements 110 each introduce a phase shift of some degrees to input signal 105, the first delay element 110 to provide first selected delay tap signal 132 having a logic-low state at the falling edge of input signal 105 can be delay element 110 that provides first selected delay tap signal 132 having a phase shift corresponding to a predetermined value. It should be appreciated that in various embodiments, phase shift detection can include sampling a rising edge of input signal 105, and phase detection may include detecting at least one of a logic-low (e.g., zero) and a logic-high (e.g., one) portions of first selected delay tap signal 132.

As illustrated in the example of FIG. 7, counter 125 indicates that a fourth delay element 110 produces first selected delay tap signal 132 that corresponds to a phase shift of a predetermined value, (180 degrees in this example, although other values may be used.) In one embodiment, phase detector 120 provides phase detection signal 134 to controller 140.

As illustrated in FIG. 7, counter 125 may provide first counter signal 170 to selector 115 indicating that selector 115 is to select, as first selected delay tap signal 132, a delay tap signal 112 provided by, for example, the fourth serially connected delay element 110. Counter 125 may also provide second counter signal 175 to selector 115 indicating which delay tap signal is to be selected as second selected delay tap signal 133. For example, when first selected delay tap signal 132 is a fourth serially connected delay element 110, second selected delay tap signal 133 may be a second serially connected delay element 110. In this illustrative embodiment, where first selected delay tap signal 132 corresponds to a 180 degree phase shift, second selected delay tap signal 133 corresponds to a 90 degree phase shift.

Continuing with the illustrative embodiment of FIG. 7, frequency multiplier circuit 100 can begin transition from calibration mode 405 to operation mode 415 when, as depicted in FIG. 7, phase detection signal 134 indicates that a fourth delay element 110 generates a signal with a phase shift corresponding to a predetermined value. Controller 140 receives phase detection signal 134 and can provide a signal to counter 125 indicating that a signal with a particular phase shift has been received. Counter 125 can identify which delay element 110 generates second selected delay tap signal 133 and can direct selector 115 to select, as second selected delay tap signal 133, the signal generated by that delay element.

Figure 8:
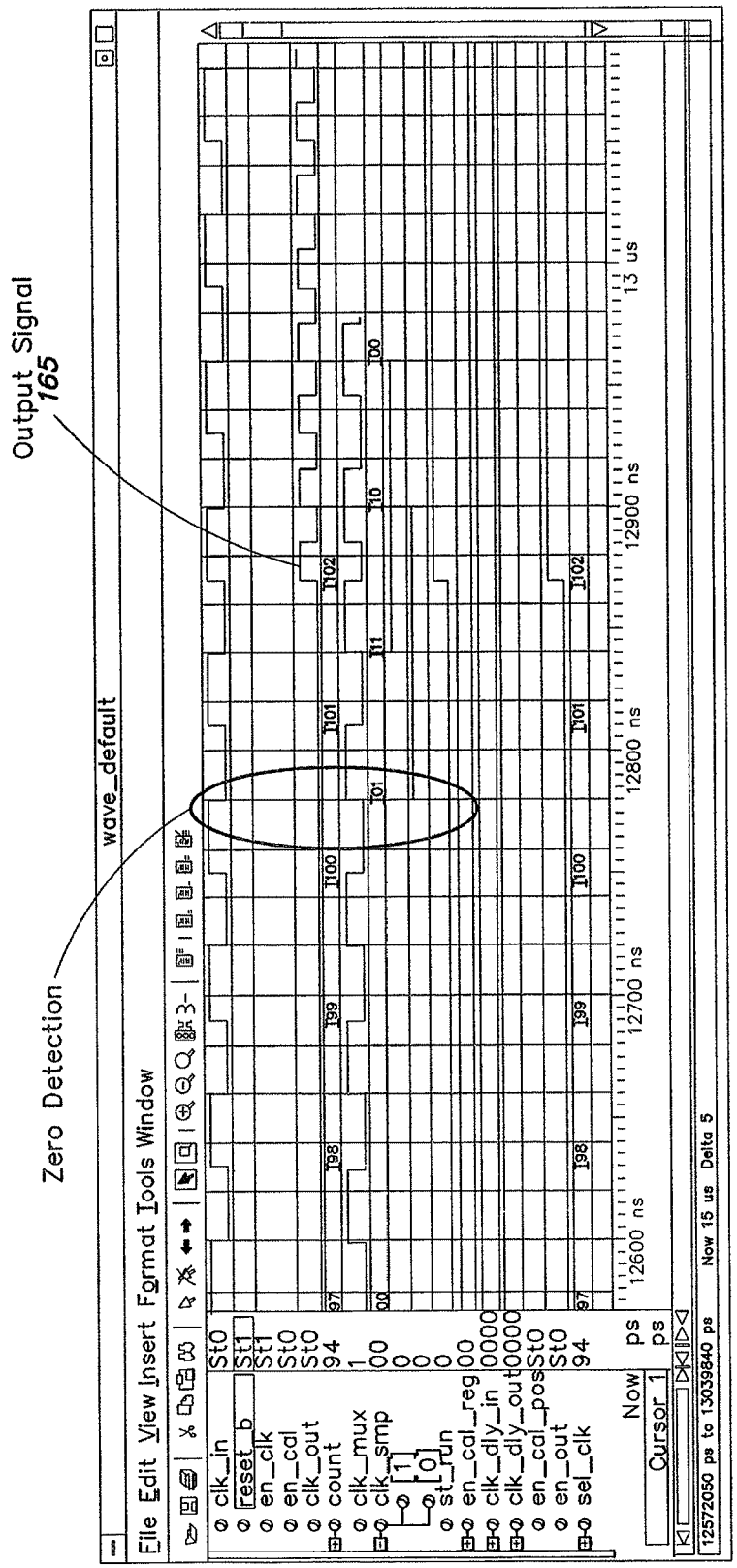
FIG. 8 is a timing diagram depicting an example of frequency multiplier circuit signals in accordance with aspects of the invention.

FIG. 8 is a timing diagram depicting an example of frequency multiplier circuit signals in accordance with aspects of the invention. As illustrated in FIG. 8, "clk_in" includes input signal 105, "clk_out" includes output signal 165, "count" includes counter 125, "clk_mux" includes first selected delay tap signal 132, "clk_smp" includes phase detection signal 134, "en_out" includes enablement signal 142, "sel_clk" includes second counter signal 175.

As illustrated in FIG. 8, a logic state, such as a zero, can be detected at first selected delay tap signal 132 during a falling edge of input signal 105. In one embodiment, this can correspond to a 180 degree phase shift between first selected delay tap signal 132 and input signal 105. In the embodiment illustrated in FIG. 8, the zero detection occurs at the $100^{th}$ delay element 110, as indicated by counter 125. This begins the transition of frequency multiplier circuit 100 from calibration mode 405 to operation mode 415. In the example of FIG. 8, frequency multiplier circuit 100 enters operation mode at the $102^{nd}$ delay element 110, as indicated by counter 125. In this example, enablement signal 142 changes states and second counter signal 175 then indicates that the delay tap signal generated by the $51^{st}$ delay element 110 is the second selected delay tap signal 133. As illustrated in FIG. 8, in operation mode 415, first selected delay tap signal 132 may continually select the signal generated by the $102^{nd}$ delay element 110, and second selected delay tap signal 133 may continually select the signal generated by the $51^{st}$ delay element 110. As illustrated in FIG. 8, four states of frequency multiplier circuit 100 can be represented in binary form at least in part by phase detection signal 134, where, for example, "00" represents calibration mode 405, "01" represents transition mode 410, "11" represents operation mode 415, and "10" represents transition mode 420.

Figure 9:
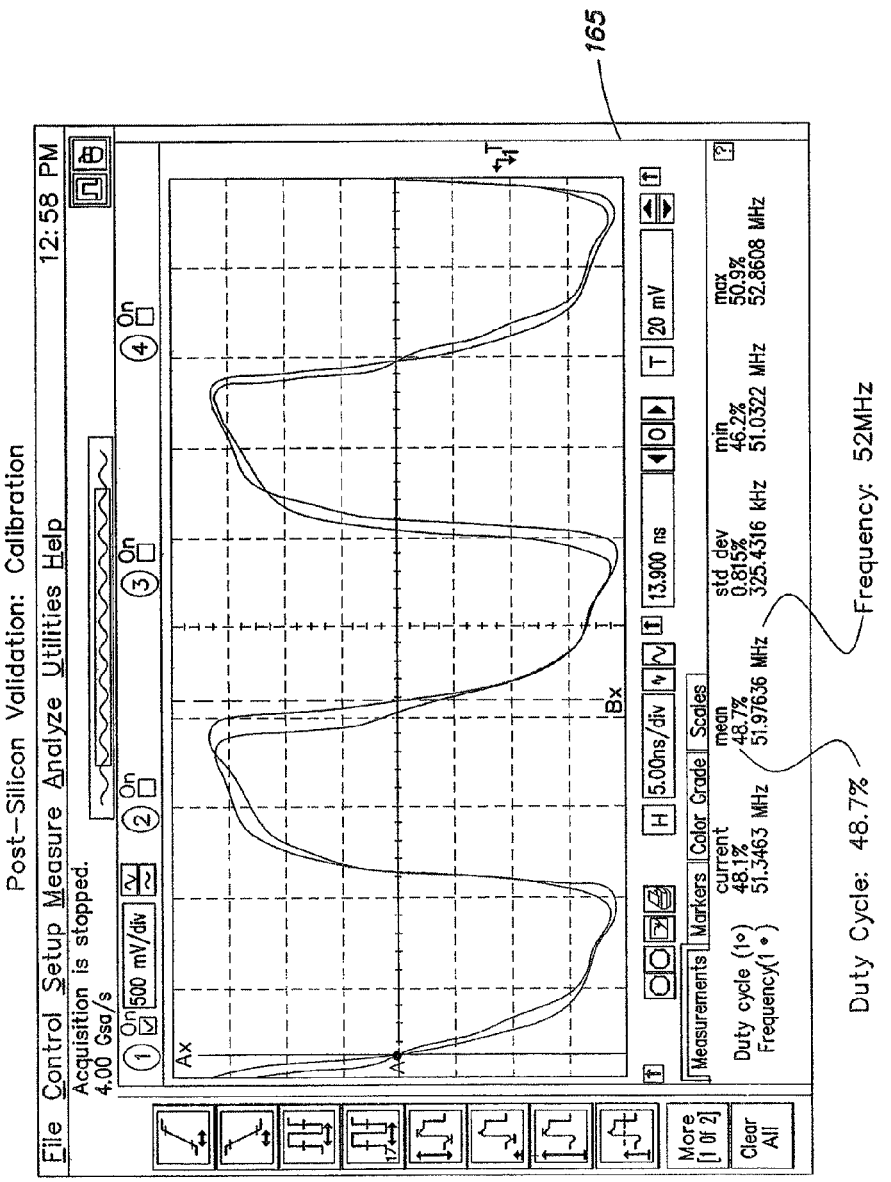
FIG. 9 is a timing diagram depicting one example of an output signal of a frequency multiplier circuit in accordance with aspects of the invention.
Figure 10:
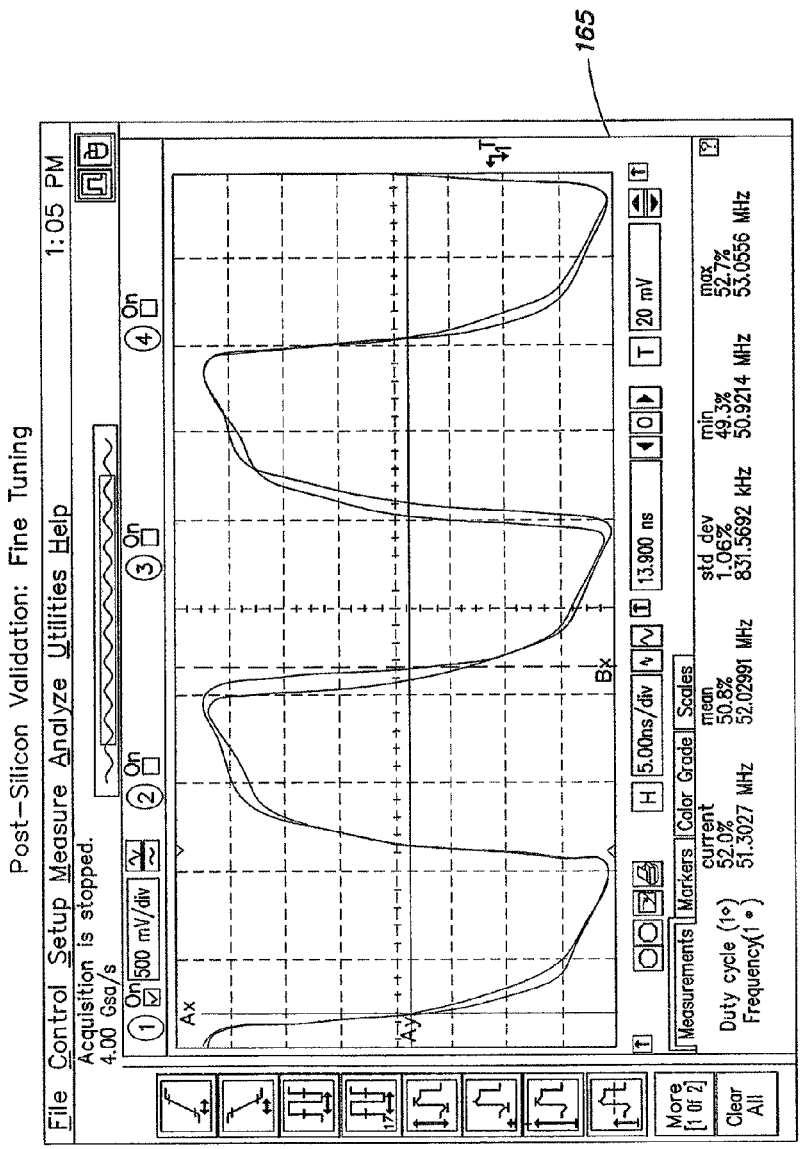
FIG. 10 is a timing diagram depicting one example of an output signal of a frequency multiplier circuit in accordance with aspects of the invention.
Figure 11:
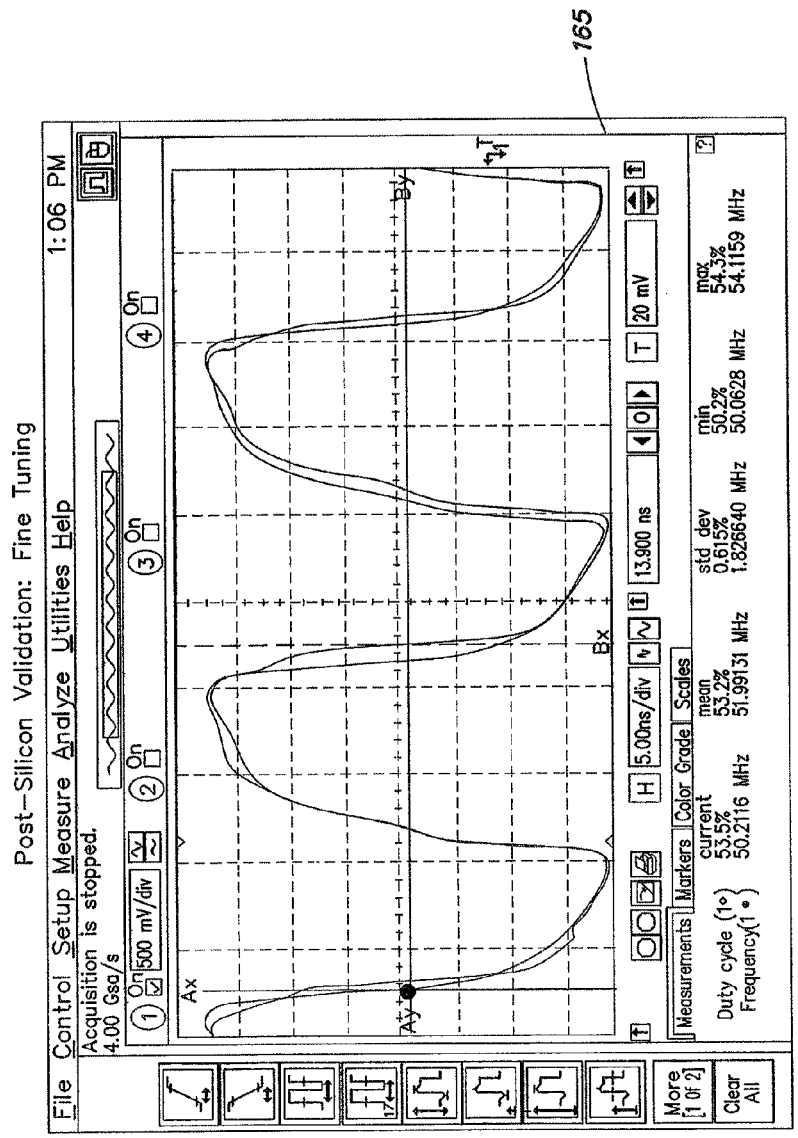
FIG. 11 is a timing diagram depicting one example of an output signal of a frequency multiplier circuit in accordance with aspects of the invention.
Figure 12:
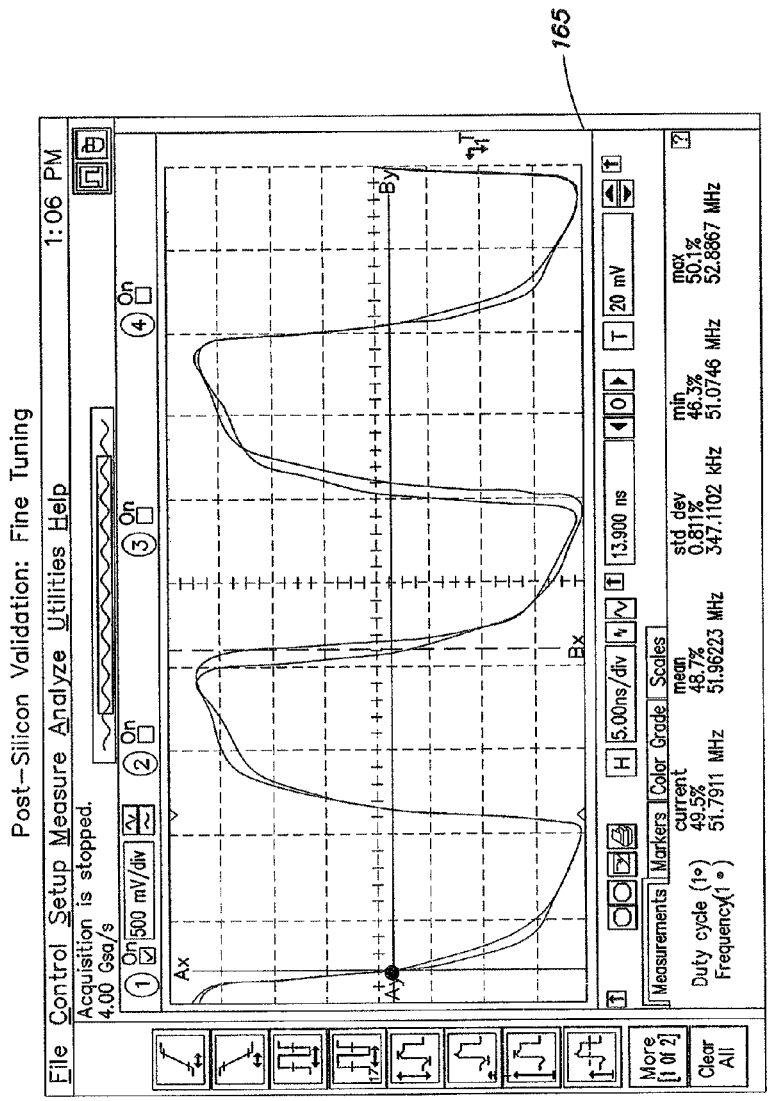
FIG. 12 is a timing diagram depicting one example of an output signal of a frequency multiplier circuit in accordance with aspects of the invention.

FIG. 9, FIG. 10, FIG. 11, and FIG. 12 are each timing diagrams depicting examples of an output signal of a frequency multiplier circuit in accordance with various aspects of the invention. As illustrated in these figures, in one embodiment, the frequency of input signal 105 can be approximately 26 MHZ and the frequency of output signal 165 can be at least 45 MHz. In various embodiments output signal 165 frequency may be between 46 MHz and 54 MHz. This 46 MHz-54 MHz range is not limiting, and the systems and methods described herein embrace both wider and narrower frequency ranges for output signal 165. In one embodiment, output signal 165 has a frequency of approximately 52 MHz. As illustrated in FIGS. 9-11, output signal 165 can be skewed or otherwise tuned to adjust the duty cycle by, for example +/−5%. It should be appreciated that the two lines as illustrated in FIGS. 9-11 depict, in these examples, measurement ranges of output signal 165. Variations in the plots shown may be due to temperature and process variations in frequency multiplier circuit 100 elements.

In one embodiment, frequency multiplier circuit 100 forms part of at least one transceiver. For example, frequency multiplier circuit 100 may provide output signal 165 as a clock signal to a digital receiver filter engine or its components that form part of a transceiver. In one embodiment, frequency multiplier circuit 100 forms part of a digital receiver filter engine. The transceiver may be compliant with GSM/EDGE or other industry standards. In one embodiment, frequency multiplier circuit 100 forms part of a GSM/EDGE transceiver. Generally, such transceivers or other chips may require on chip higher speed clock generation from a lower speed clock that provides input signal 105. For example, a crystal clock on a transceiver or other chip may generate a clock signal with a frequency of 26 MHz and the transceiver may require a clock signal with a frequency of at least 45 MHz. In one embodiment, frequency multiplier circuit 100 may receive the 26 MHz clock signal as input signal 105 and provide output signal 165, with a frequency of at least 45 MHz. A transceiver or associated elements may require clock signals with a particular duty cycle range. In one embodiment, a duty cycle of output signal 165 can be in the range of 46% to 54%. This 46%-54% range is not limiting, and the systems and methods described herein embrace both wider and narrower duty cycle ranges of output signal 165. In one embodiment, a duty cycle range of output signal 165 can be 50%+/−2%. In one embodiment, output signal 165 can be applied to a transceiver or its associated elements. The transceiver may be included in a mobile telephone, PDA, or other device.

In one embodiment, a cell array of frequency multiplier circuit 100 is a maximum of 1000 gates, and may be placed and routed into, for example, a transceiver. In one embodiment, frequency multiplier circuit 100 has a maximum area of 0.02 mm$^2$, (approximately 0.000031 in$^2$.) In another embodiment, the maximum area of frequency multiplier circuit 100 can be 0.013 mm$^2$, (approximately 0.000020 in$^2$.) For example, frequency multiplier circuit 100 may have dimensions of 110 μm×120 μm, (approximately 0.0043 in×0.0047 in.) In one embodiment, frequency multiplier circuit, when activated, draws a maximum of 300 μA of current. Frequency multiplier circuit 100 may also be integrated on a top level of a RF EDGE transceiver.

Figure 13:
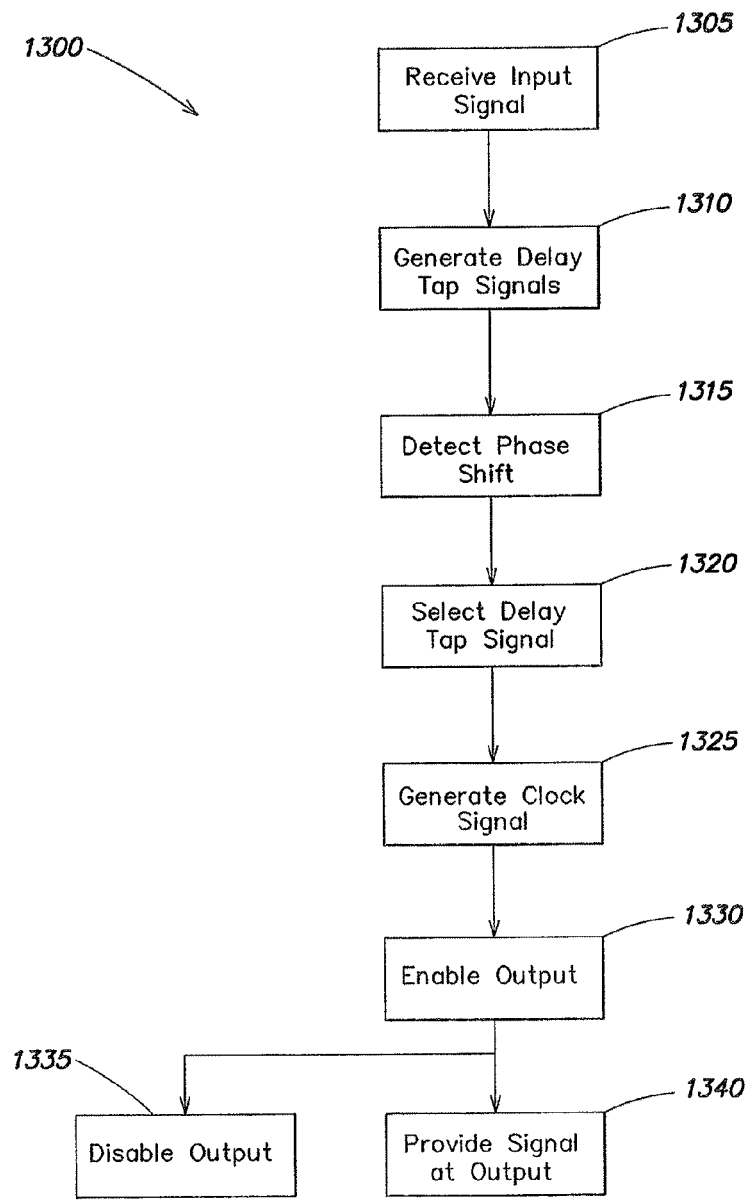
FIG. 13 is a flow chart depicting an example of a method of providing a clock signal in accordance with aspects of the invention.

FIG. 13 is a flow chart depicting one example of a method 1300 of providing a clock signal in accordance with aspects of the invention. In one embodiment, method 1300 receives an input signal (ACT 1305). Receiving an input signal (ACT 1305) may include receiving a signal generated from a crystal clock on a transceiver or other type of electronic chip. In one embodiment, receiving an input signal (ACT 1305) includes a receiving a system clock having a frequency of, for example, approximately 26 MHz. Other frequencies are possible in various embodiments. Receiving an input signal (ACT 1305) can include receiving any clock signal having a frequency and a duty cycle.

In one embodiment, receiving an input signal (ACT 1305) includes receiving an input signal that has been enabled for transmission to a frequency multiplier circuit by, for example, a digital logic gate. For example, an AND gate may receive an input signal as well as an input signal enablement signal that enables transmission of an input signal to a frequency multiplier circuit, where it may be received, (ACT 1305). Receiving an input signal (ACT 1305) may include at least one of a plurality of delay elements receiving an input signal. For example, the delay elements may be serially connected so that the input signal, when received, cascades through the plurality of delay elements.

Method 1300 may include an act of generating a plurality of delay tap signals from the input signal (ACT 1310). For example, the input signal may be received (ACT 1305) by at least one of a plurality of serially connected delay elements so that the input signal successively flows through the delay elements. Although the number of delay elements can vary, in one embodiment, 128 serially connected delay lines can each provide at least one delay tap signal, which generally includes the input signal phase shifted by some amount. In one embodiment, each delay element may receive, as input, either the input signal or an output signal of another delay element (ACT 1305). In response to receiving an input signal (ACT 1305), method 1300 may proceed to generate or provide at least one delay tap signal. Generating at least one delay tap signal (ACT 1310) may include providing or creating at least one delay clock signal. For example, generating delay tap signals (ACT 1310) may include providing at least one signal having a phase shift with respect to the input signal. In one embodiment, each delay element to receive an input signal (ACT 1305) may proceed to generate at least one delay tap signal (ACT 1310) having a phase shift with respect to the input signal. Each of a plurality of delay tap elements may generate or be configured to generate a delay tap signal.

In one embodiment, method 1300 detects a phase shift between the input signal and a first delay tap signal (ACT 1315). For example, a received (ACT 1305) input signal may be compared with a generated (ACT 1310) delay tap signal to detect (ACT 1315) a phase shift between the two signals. Although phase shifts of delay tap signals may be of any degree with respect to an input signal, in one embodiment, detecting a phase shift of a delay tap signal (ACT 1315) includes detecting a 180 degree phase shift. For example, detecting a phase shift (ACT 1315) can include sampling a first selected delay tap signal at successive falling edges of an input signal. For example, detecting a logic-zero during a falling edge of an input signal may indicate that a selected delay tap signal is at least 180 degrees out of phase with respect to an input signal. In one embodiment, detecting a phase shift (ACT 1315) includes sampling a rising edge of an input signal. Detecting a phase shift (ACT 1315) can also include detecting at least one of a logic-low (e.g., zero) and a logic-high (e.g., one) portions of a selected delay tap signal. Detecting a phase shift, (ACT 1315) may include sampling a falling edge of both an input signal and a falling edge of a delay tap signal.

In one embodiment, method 1300 can select at least one delay tap signal (ACT 1320). For example, selecting a delay tap signal (ACT 1320) may include identifying one of a plurality of delay tap signals as a signal having a phase shift corresponding to a predetermined value. Selecting a delay tap signal (ACT 1320) may include receiving a plurality of delay tap signals from a plurality of delay elements and sequentially outputting a selected one of the delay tap signals. Selecting a delay tap signal (ACT 1320) may include selecting one of a plurality of delay tap signals based at least in part on a counter signal indicative of a delay element that produces a delay tap signal targeted for selection.

In one embodiment, selecting a delay tap signal (ACT 1320) includes a logic device such as a multiplexor receiving a plurality of signals as input, and providing one of the plurality of signals as output. For example, selecting at least one delay tap signal (ACT 1320) may include receiving, in a first iteration of a frequency multiplier circuit, one delay tap signal, and selecting that signal as a signal to be provided to a logic device such as a phase detector. Continuing with this example, a different delay tap signal may be received and provided to the logic device in a subsequent iteration.

In another embodiment, selecting at least one delay tap signal (ACT 1320) may include receiving a signal indicating that one of a plurality of delay elements provides a delay tap signal having a desired phase shift, and selecting that delay tap signal. For example, selecting a delay tap signal (ACT 1320) may include selecting a delay tap signal having an approximate phase shift of, for example 90 degrees relative to an input signal. In another example, selecting a delay tap signal (ACT 1320) may include selecting a delay tap signal having an approximate phase shift of 180 degrees relative to an input signal. It should be appreciated that method 1300 may include selecting (ACT 1320) delay tap signals having phase shifts ranging from zero to 360 degrees with respect to an input signal.

In one embodiment, method 1300 includes an act of generating at least one clock signal (ACT 1325). For example, generating a clock signal (ACT 1325) may include generating a clock signal responsive at least in part to an input signal and a second delay tap signal. In one embodiment, generating a clock signal (ACT 1325) can include combining an input signal and a selected delay tap signal that has a phase shift relative to the input signal. This phase shift may be, for example, approximately 90 degrees. In one embodiment, selecting a delay tap signal (ACT 1320) includes selecting a delay tap signal with a phase shift that is half of a phase shift detected in detecting act (ACT 1315). For example, generating a clock signal (ACT 1325) may include providing an input signal and a selected delay tap signal as input into at least one digital logic gate, such as a NOR or XNOR gate. Continuing with this example, generating a clock signal (ACT 1325) may include combining the input signal with the selected delay tap signal.

Generating a clock signal (ACT 1325) may include generating an output signal having a frequency greater than a frequency of an input signal. For example, an input signal may have a frequency of approximately 26 MHz, and generating a clock signal (ACT 1325) may include generating an output signal having a frequency of approximately 52 MHz. In one embodiment, generating a clock signal (ACT 1325) includes generating an output signal having a duty cycle of approximately 50%. It should be appreciated that generating a clock signal (ACT 1325) may include generating signals having a range of characteristics, such as frequencies and duty cycles. In one embodiment, generating a clock signal (ACT 1325) may include generating an output signal for use by a transceiver. In a further embodiment, generating a clock signal (ACT 1325) includes generating a clock output signal for a frequency multiplier circuit on a transceiver chip where an input signal to the frequency multiplier circuit originated from a crystal clock signal generator on the transceiver chip. Generating a clock signal may also include generating a signal having a frequency of at least 45 MHz.

In one embodiment, method 1300 can include an act of enabling an output responsive to a selected signal having a phase shift of a predetermined value (ACT 1330). For example, enabling an output (ACT 1330) may include enabling an output of a frequency multiplier circuit. In one embodiment, enabling an output (ACT 1330) may include providing at least one digital logic device such as a multiplexor or an AND gate configured to receive the generated (ACT 1325) clock signal as well as an enablement signal. Enabling an output (ACT 1330) generally allows an output signal to be provided upon the satisfaction of set parameters. For example, enabling an output (ACT 1330) may be preconditioned on an output signal having a predetermined value. In one embodiment, enabling an output (ACT 1330) includes providing an output responsive to an output signal matching predetermined characteristics, such as a duty cycle of approximately 47% to 53%, or a frequency of at least 45 MHz, for example. In one embodiment, enabling an output (ACT 1330) includes enabling an output responsive to a phase shift having a predetermined value of approximately 180 degrees. These numbers and ranges are examples and are not limiting.

In one embodiment, where an output signal does not match predetermined characteristics, method 1300 may disable an output (ACT 1335). For example, disabling an output (ACT 1335) may include disabling an output responsive to a phase shift of a selected delay tap signal having a value that is different from a predetermined value. In one embodiment disabling an output (ACT 1335) includes preventing a clock signal to pass from a frequency multiplier circuit as output.

Method 1300 may include an act of providing a clock signal at an output (ACT 1340). In one embodiment, providing the clock signal at an output (ACT 1340) includes providing a clock signal at an output of a frequency multiplier circuit that forms part of a transceiver used by a mobile telephone that may communicate over a network, such as a Global System for Mobile Communications (GSM) network, a General Packet Radio Service (GPRS) network, a Code Division Multiple Access Network, a Time Division Multiple Access Network, and an Enhanced Data Rate for GSM Evolution (EDGE) network, for example. Providing a signal at an output (ACT 1340) generally includes making a digital clock signal available for use by any electronic device, circuit, or component.

Note that in FIGS. 1 through 13, the enumerated items are shown as individual elements. In actual implementations of the systems and methods described herein, however, they may be inseparable components of other electronic devices such as a digital computer. Thus, actions described above may be implemented at least in part in software that may be embodied in an article of manufacture that includes a program storage medium. The program storage medium includes data signals embodied in one or more of a computer disk (magnetic, or optical (e.g., CD or DVD, or both), non-volatile memory, tape, a system memory, and a computer hard drive.

From the foregoing, it will be appreciated that the systems and methods described herein afford a simple and effective way to generate a clock signal. The systems and methods according to various embodiments are able to detect a phase of a delayed clock signal relative to the clock signal, and to identify a delay element that generates a delay tap signal with characteristics that enable generation of a reliable and accurate output clock signal with, for example, a 50% duty cycle and a frequency of approximately double a frequency of an input signal. These systems and methods can be embodied in a frequency multiplier circuit having a small footprint and that requires a minimal amount of current to operate. This increases efficiency and compatibility, and lowers cost.

Any references to front and back, left and right, top and bottom, and upper and lower are intended for convenience of description, not to limit the present systems and methods or their components to any one positional or spatial orientation.

Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements.

Any embodiment disclosed herein may be combined with any other embodiment, and references to "an embodiment", "some embodiments", "an alternate embodiment", "various embodiments", "one embodiment" or the like are not necessarily mutually exclusive and are intended to indicate that a particular feature, structure, or characteristic described in connection with the embodiment may be included in at least one embodiment. The appearances of such terms herein are not necessarily all referring to the same embodiment. Any embodiment may be combined with any other embodiment in any manner consistent with the objects, aims, and needs disclosed herein.

References to "or" may be construed as inclusive so that any terms described using "or" may indicate any of a single, more than one, and all of the described terms.

Where technical features mentioned in any claim are followed by reference signs, the reference signs have been included for the sole purpose of increasing the intelligibility of the claims and accordingly, neither the reference signs nor their absence have any limiting effect on the scope of any claim elements.

Having thus described several aspects of at least one embodiment, it is to be appreciated various alterations, modifications, and improvements will readily occur to those skilled in the art. For example, a single delay element may provide a plurality of delay tap signals, or a plurality of delay elements may be arranged in a parallel, serial, or hybrid combination so generate delay tap signals having various phase shifts relative to each other and to an input signal. Furthermore, it should be appreciated that in various embodiments, any of the controller, phase detector, digital logic gate, output gate, first inverter, second inverter, calibration gate, selector, and that any other elements may be combined into one or more elements or devices of the frequency multiplier circuit described herein. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A frequency multiplier circuit, comprising:
   a plurality of serially connected delay elements configured to generate a plurality of delay tap signals from an input signal;
   a phase detector configured to receive a first selected delay tap signal and the input signal, to detect a phase shift between the first selected delay tap signal and the input signal, and to generate a phase detection signal indicative of a value of the phase shift;
   a digital logic gate configured to receive the input signal, the input signal bypassing the plurality of delay elements, and to receive a second selected delay tap signal, the digital logic gate further configured to generate an output signal responsive to the second selected delay tap signal and the input signal;
   a controller coupled to the phase detector and an output gate, the controller configured to receive the phase detection signal and to enable the output gate when the value of the phase shift corresponds to a predetermined value; and
   a counter configured to generate a first counter signal indicative of a first number of delay elements that produce the first selected delay tap signal and a second counter signal indicative of a second number of delay elements that produce the second selected delay tap signal; and
   wherein, when enabled, the output gate provides the output signal.

2. The frequency multiplier circuit of claim 1, wherein the phase shift between the first selected delay tap signal and the input signal is approximately 180 degrees, and wherein a phase shift between the second selected delay tap signal and the input signal is approximately 90 degrees.

3. The frequency multiplier circuit of claim 1, comprising:
   a multiplexor coupled to the phase detector, the digital logic gate, the counter, and the plurality of serially connected delay elements, the multiplexor configured to receive the plurality of delay tap signals, the first counter signal, and the second counter signal;
   wherein the multiplexor is configured to select the first selected delay tap signal and the second selected delay tap signal; and
   wherein the multiplexor is further configured to provide the first selected delay tap signal to the phase detector, and to provide the second selected delay tap signal to the digital logic gate.

4. The frequency multiplier circuit of claim 1, comprising:
   a first multiplexor coupled to the phase detector, the counter, and the plurality of serially connected delay elements, the first multiplexor configured to receive the plurality of delay signals and the first counter signal, to select the first selected delay tap signal, and to provide the first selected delay tap signal to the phase detector; and
   a second multiplexor coupled to the digital logic gate, the counter, and the plurality of serially connected delay elements, the second multiplexor configured to receive the plurality of delay tap signals and the second counter signal, to select the second selected delay tap signal, and to provide the second selected delay tap signal to the digital logic gate.

5. The frequency multiplier circuit of claim 1, comprising:
   a multiplexor configured to select at least one of the first selected delay tap signal and the second selected delay tap signal from the plurality of delay tap signals to provide the first selected delay tap signal to the phase detector, and to provide the second selected delay tap signal to the digital logic gate.

6. The frequency multiplier circuit of claim 1, wherein a frequency of the output signal is at least about 45 MHz.

7. The frequency multiplier circuit of claim 1, wherein the output signal has a duty cycle between about 45% and 55%.

8. The frequency multiplier circuit of claim 1, wherein a frequency of the input signal is between about 25 MHz and 27 MHz, and wherein a frequency of the output signal is between about 50 MHz and 54 MHz.

9. The frequency multiplier circuit of claim 1, wherein the frequency multiplier circuit forms part of a transceiver configured for data communication through at least one of a Global System for Mobile Communications (GSM) network, a General Packet Radio Service (GPRS) network, a Code Division Multiple Access Network, a Time Division Multiple Access Network, and an Enhanced Data Rate for GSM Evolution (EDGE) network.

10. The frequency multiplier circuit of claim 1, wherein the frequency multiplier circuit includes a cell array having a maximum of 1000 gates, wherein the digital circuit has a maximum area of 0.025 $mm^2$, and wherein the digital circuit operates with a maximum current of 300 μA.

11. The frequency multiplier circuit of claim 1, wherein the frequency multiplier circuit has a maximum area of 0.013 $mm^2$ and wherein the digital circuit draws a maximum current of 200 μA.

12. The frequency multiplier of claim 1, wherein the frequency multiplier circuit has a maximum length of 120 μm and a maximum width of 110 μm.

13. The frequency multiplier circuit of claim 1, wherein the frequency multiplier circuit forms part of a digital receiver filter engine.

14. The frequency multiplier circuit of claim 1, wherein the digital logic gate is configured to directly receive the input signal.

15. The frequency multiplier circuit of claim 1, comprising:

an inverter configured to receive the input signal and to generate an inverted input signal, wherein the phase detector is configured to generate the phase detection signal based on the inverted input signal.

16. The frequency multiplier circuit of claim 1, wherein the second number of delay elements is half of the first number of delay elements.

17. A method of providing a clock signal, comprising:
receiving an input signal;
generating a plurality of delay tap signals from the input signal by passing the input signal through a plurality of delay tap elements;
detecting a phase shift between the input signal that bypasses the plurality of delay tap elements, and a first delay tap signal;
selecting a second delay tap signal based at least in part on a value of the phase shift;
generating the clock signal responsive to the input signal that bypasses the plurality of delay tap elements, and the second delay tap signal;
enabling an output responsive to the phase shift having a predetermined value;
counting a number of the plurality of delay elements that are configured to generate the first delay tap signal;
based on the number of delay elements that are configured to generate the first delay tap signal, identifying at least one delay element configured to generate the second delay tap signal; and
providing the clock signal at the output.

18. The method of claim 17, wherein generating the clock signal comprises generating a clock signal having a duty cycle of at least 45%.

19. The method of claim 17, comprising:
disabling the output responsive to the phase shift having a value that is different than the predetermined value.

20. The method of claim 17, wherein enabling the output comprises enabling the output responsive to the predetermined value being substantially 180 degrees, and wherein selecting the second delay tap signal comprises selecting one of the plurality of delay tap signals so as to provide a substantially 90 degree phase shift between the second delay tap signal and the input signal.

21. The method of claim 17, wherein detecting the phase shift comprises:
sampling a falling edge of the input signal; and
sampling a falling edge of the first delay tap signal.

22. The method of claim 17, wherein receiving the input signal, generating the plurality of delay tap signals, detecting the phase shift, selecting the second delay tap signal, generating the clock signal, enabling the output, and providing the clock signal at the output are performed at least in part by a processor, and wherein the method is implemented at least in part by a program stored in a computer readable medium and executed by the processor.

23. The method of claim 17, wherein receiving the input signal, generating the plurality of delay tap signals, detecting the phase shift, selecting the second delay tap signal, generating the clock signal, enabling the output, and providing the clock signal at the output are performed at least in part by at least one logic element of a transceiver chip.

24. The method of claim 17, comprising providing the clock signal at the output to drive a transceiver chip that forms part of a mobile telephone, the mobile telephone configured for communication through at least one of a Global System for Mobile Communications (GSM) network, a General Packet Radio Service (GPRS) network, a Code Division Multiple Access Network, a Time Division Multiple Access Network, and an Enhanced Data Rate for GSM Evolution (EDGE) network.

25. The method of claim 17, wherein identifying the at least one delay element includes:
dividing the number of serially connected delay elements that are configured to generate the first delay tap signal in half to identify the at least one delay element configured to generate the second delay tap signal.

26. The method of claim 17, wherein the number of delay elements includes a number of serially connected delay elements.

27. The method of claim 26, wherein generating the plurality of delay tap signals comprises:
providing the number of serially connected delay elements, each serially connected delay element configured to generate one of the plurality of delay tap signals, at least one of the number of serially connected delay elements configured to generate the first delay tap signal, and at least one of the number of serially connected delay elements configured to generate the second delay tap signal.

28. A frequency multiplier circuit that generates a digital output clock signal, comprising:
a plurality of connected delay elements configured to produce a plurality of time delay tap signals from a digital input clock signal;
a counter configured to identify a number of delay elements that produce a first time delay tap signal indicative of a first phase shift of the digital input clock signal;
the counter configured to identify, based at least in part on the number of delay elements that produce the first time delay tap signal, a second delay tap signal indicative of a second phase shift in the digital input clock signal;
the counter configured to generate a first counter signal indicative of a first number of delay elements that produce the first selected delay tap signal and a second counter signal indicative of a second number of delay elements that produce the second selected delay tap signal;
means for generating the digital output clock signal based on the digital input clock signal that bypasses the plurality of connected delay elements, and based on the second delay tap signal; and
a controller coupled to the counter, the controller configured to enable a frequency multiplier circuit output responsive to the first phase shift having a predetermined value, the frequency multiplier circuit output configured to provide the digital output clock signal.

29. The frequency multiplier circuit of claim 28, wherein the second number of delay elements is half of the first number of delay elements.

* * * * *